(12) United States Patent
Cheng et al.

(10) Patent No.: US 12,543,552 B2
(45) Date of Patent: Feb. 3, 2026

(54) SEMICONDUCTOR DEVICE STRUCTURE WITH CONDUCTIVE BUMPS

(71) Applicant: Taiwan Semiconductor Manufacturing Company, Ltd., Hsinchu (TW)

(72) Inventors: Ming-Da Cheng, Taoyuan (TW); Wei-Hung Lin, Xinfeng Township, Hsinchu County (TW); Hui-Min Huang, Taoyuan (TW); Chang-Jung Hsueh, Taipei (TW); Po-Hao Tsai, Taoyuan (TW); Yung-Sheng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 57 days.

(21) Appl. No.: 18/522,622

(22) Filed: Nov. 29, 2023

(65) Prior Publication Data

US 2024/0096787 A1 Mar. 21, 2024

Related U.S. Application Data

(62) Division of application No. 17/459,135, filed on Aug. 27, 2021, now Pat. No. 11,854,964.

(51) Int. Cl.
*H01L 23/522* (2006.01)
*H01L 21/48* (2006.01)
*H01L 23/00* (2006.01)

(52) U.S. Cl.
CPC ........ *H01L 23/5226* (2013.01); *H01L 21/486* (2013.01); *H01L 24/14* (2013.01)

(58) Field of Classification Search
CPC .... H01L 23/5226; H01L 21/486; H01L 24/14
See application file for complete search history.

(56) References Cited

U.S. PATENT DOCUMENTS

| 9,000,584 | B2 | 4/2015 | Lin et al. |
| 9,041,211 | B2 * | 5/2015 | Uchiyama ......... H01L 23/49827 257/723 |
| 9,048,222 | B2 | 6/2015 | Hung et al. |
| 9,048,233 | B2 | 6/2015 | Wu et al. |
| 9,064,879 | B2 | 6/2015 | Hung et al. |

(Continued)

*Primary Examiner* — Trang Q Tran
(74) *Attorney, Agent, or Firm* — McClure, Qualey & Rodack, LLP

(57) ABSTRACT

A semiconductor device structure is provided. The semiconductor device structure includes an interconnection structure over a semiconductor substrate and a conductive pillar over the interconnection structure. The conductive pillar has a protruding portion extending towards the semiconductor substrate from a lower surface of the conductive pillar. The semiconductor device structure also includes an upper conductive via between the conductive pillar and the interconnection structure and a lower conductive via between the upper conductive via and the interconnection structure. The lower conductive via is electrically connected to the conductive pillar through the upper conductive via. The conductive pillar extends across opposite sidewalls of the upper conductive via and opposite sidewalls of the lower conductive via. A top view of an entirety of the second conductive via is separated from a top view of an entirety of the protruding portion.

20 Claims, 18 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0151527 A1 | 5/2018 | Chang et al. |
| 2019/0103353 A1 | 4/2019 | Liu et al. |
| 2020/0105634 A1 | 4/2020 | Huang et al. |
| 2020/0135676 A1 | 4/2020 | Kalnitsky et al. |
| 2021/0028145 A1 | 1/2021 | Yu et al. |

\* cited by examiner

SEMICONDUCTOR DEVICE STRUCTURE WITH CONDUCTIVE BUMPS

PRIORITY CLAIM AND CROSS-REFERENCE

This Application is a Divisional of U.S. application Ser. No. 17/459,135, filed on Aug. 27, 2021, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
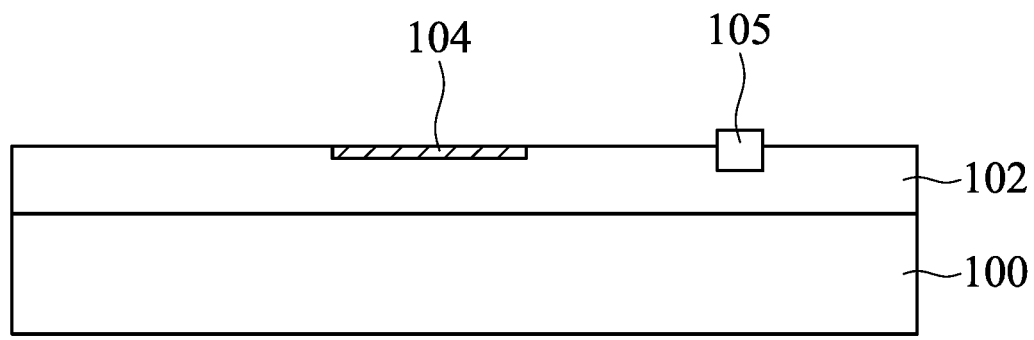
FIGS. 1A-1J are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5% or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1J are cross-sectional views of various stages of a process for forming a portion of a semiconductor device structure, in accordance with some embodiments. As shown in FIG. 1A, a semiconductor substrate 100 is provided. In some embodiments, the semiconductor substrate 100 includes one or more semiconductor materials. In some embodiments, the semiconductor substrate 100 includes a semiconductor wafer (such as a silicon wafer) or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof.

In some embodiments, the semiconductor substrate 100 includes isolation features (not shown). The isolation features may define and isolate various device elements (not shown) formed in and/or on the semiconductor substrate 100. The isolation features include shallow trench isolation (STI) features, local oxidation of silicon (LOCOS) features, other suitable isolation features, or a combination thereof.

Examples of the various device elements, which may be formed in and/or on the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, one or more other suitable elements, or a combination thereof.

Various processes are performed to form the various device elements, which include, for example, deposition, photolithography, etching, implantation, annealing, planarization, and/or other applicable processes. In some embodiments, the various device elements are interconnected to form an integrated circuit device. The integrated circuit device includes, for example, a logic device, a memory device (such as static random access memory (SRAM) and/or dynamic static random access memory (DRAM)), radio frequency (RF) device, input/output (I/O) device, system-on-chip (SoC) device, other applicable devices, or a combination thereof.

As shown in FIG. 1A, an interconnection structure 102 is formed over the semiconductor substrate 100, in accordance with some embodiments. The interconnection structure 102 includes multiple dielectric layers and various conductive features surrounded by the dielectric layers. The conductive features include, for example, multiple horizontal interconnects, such as conductive lines, and multiple vertical interconnects, such as conductive vias and conductive contacts. The conductive features form conductive paths between the device elements (not shown) formed in and/or on the semiconductor substrate 100. The formation of the interconnection structure 102 may involve multiple deposition processes, multiple patterning processes, and multiple planarization processes.

Some of the conductive features of the interconnection structure 102 are shown in FIG. 1A. As shown in FIG. 1A, a conductive feature 104 that may function as a top metal layer is illustrated. The thickness of the conductive feature 104 may be in a range from about 0.3 μm to about 5 μm. The conductive feature 104 is used to provide electrical connection to a conductive pillar that will be formed over the conductive feature 104 later. The conductive feature 104 may be made of or include copper, aluminum, gold, one or more other suitable materials, or a combination thereof.

As shown in FIG. 1A, a device element 105 is formed over or in the interconnection structure 102, in accordance with some embodiments. The device element 105 may be a passive device such as a metal-insulator-metal capacitor. In some embodiments, an upper portion of the device element 105 is above the top surface of the interconnection structure 102, and a lower portion of the device element 105 is below the top surface of the interconnection structure 102. In some other embodiments, the entirety of the device element 105 is above the top surface of the interconnection structure 102. Alternatively, in some other embodiments, the device element 105 is embedded in the interconnection structure 102.

Figure 1B:
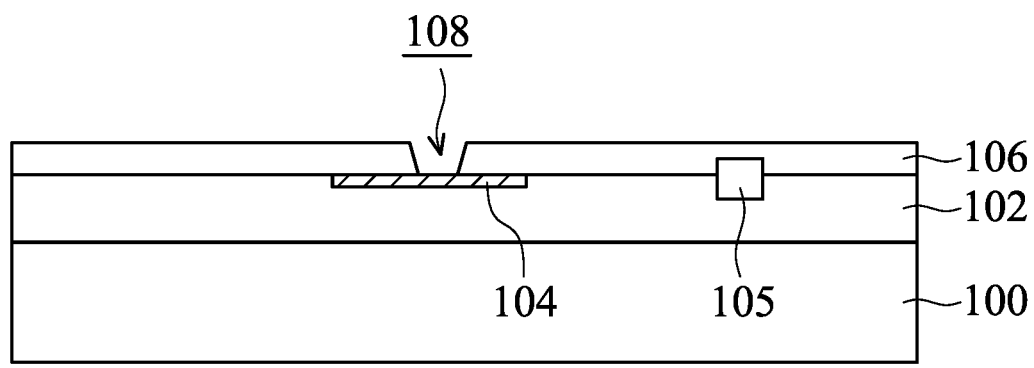

As shown in FIG. 1B, a passivation layer 106 is formed over the interconnection structure 102, in accordance with some embodiments. The passivation layer 106 may be used to protect the interconnection structure 102. The passivation layer 106 may be made of a dielectric material. The dielectric material may be made of or include silicon nitride, silicon oxynitride, silicon carbide, one or more other suitable materials, or a combination thereof. Alternatively, the passivation layer 106 may be made of or include an organic material and/or a polymer-containing material. The organic material may include polyimide (PI), polybenzoxazole (PBO), benzocyclobutene (BCB), one or more other suitable materials, or a combination thereof. The organic material may be photosensitive. The passivation layer 106 may be formed using a chemical vapor deposition (CVD) process, a physical vapor deposition (PVD) process, a spin coating process, one or more other applicable processes, or a combination thereof.

As shown in FIG. 1B, the passivation layer 106 is partially removed to form an opening 108, in accordance with some embodiments. The opening 108 expose the conductive feature 104. In some embodiments where the passivation layer 106 is made of a dielectric layer such as silicon nitride or silicon oxynitride, the opening 108 is formed using a photolithography process and an etching process. In some other embodiments where the passivation layer 106 is made of a photosensitive polymer material such as PI or PBO, the opening 108 is formed using a photolithography process.

Figure 1C:
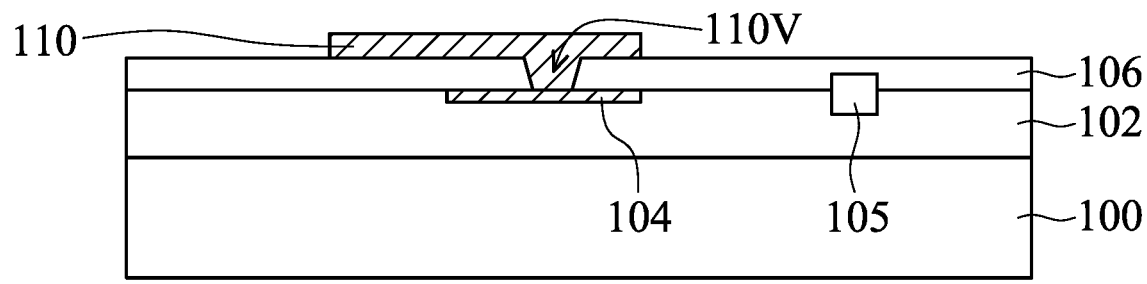

As shown in FIG. 1C, a conductive feature 110 is formed, in accordance with some embodiments. The conductive feature 110 extends into the opening 108 to form electrical connection to the conductive feature 104, as shown in FIG. 1C. The portion of the conductive feature 110 filling the opening 108 forms a conductive via 110V. The top view of the conductive via 110V may have a circular profile, an oval profile, a rectangular profile, a square profile, or the like.

The portion of the conductive feature 110 over the top surface of the passivation layer 106 may function as a conductive line for routing. In some embodiments, the conductive line of the conductive feature 110 is thicker than the conductive feature 104. The thickness of the conductive line of the conductive feature 110 may be in a range from about 1 μm to about 10 μm.

The conductive feature 110 may be made of or include copper, aluminum, gold, cobalt, titanium, one or more other suitable materials, or a combination thereof. The conductive feature 110 may be formed using an electroplating process, an electroless plating process, a CVD process, a PVD process, one or more other applicable processes, or a combination thereof. The formation of the conductive feature 110 may further involve one or more patterning processes and/or one or more etching processes.

Figure 1D:
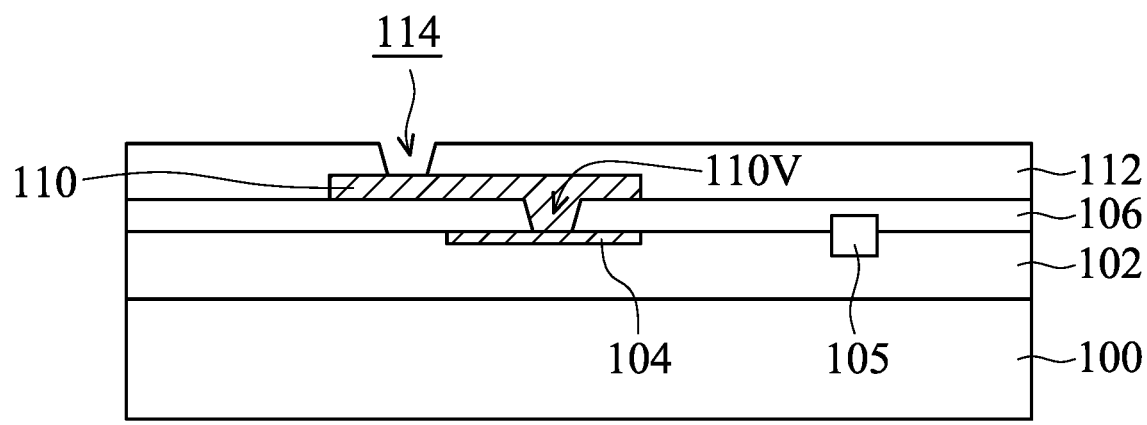

As shown in FIG. 1D, an insulating layer 112 is formed over the passivation layer 106 and the conductive feature 110, in accordance with some embodiments. The material and formation method of the insulating layer 112 may be the same as or similar to those of the passivation layer 106. For example, the insulating layer 112 is made of or include a polymer material such as PI, PBO, one or more other suitable materials, or a combination thereof. In some embodiments, the insulating layer 112 is in direct contact with the passivation layer 106.

As shown in FIG. 1D, the insulating layer 112 is partially removed to form an opening 114, in accordance with some embodiments. The opening 114 partially exposes the conductive feature 110. In some embodiments, the opening 114 is misaligned with the opening 108 previously formed in the passivation layer 106. The misalignment arrangement of the upper openings and the lower openings may help to reduce stress applied on the conductive vias that are formed in these openings. In some embodiments, the opening 114 is laterally separated from the conductive via 110 that fills the opening 108 previously formed in the passivation layer 106, as shown in FIG. 1D. The opening 114 does not overlap the conductive via 110V in the vertical direction that is perpendicular to the main surface of the semiconductor substrate 100.

In some embodiments, the insulating layer 112 is made of a photosensitive polymer material. In such cases, the opening 114 may be formed using a photolithography processes. In some other embodiments, the insulating layer 112 is made of a dielectric material such as silicon nitride, silicon oxynitride, and/or silicon oxide. In such cases, the opening 114 may be formed using a photolithography process and an etching process.

Figure 1E:
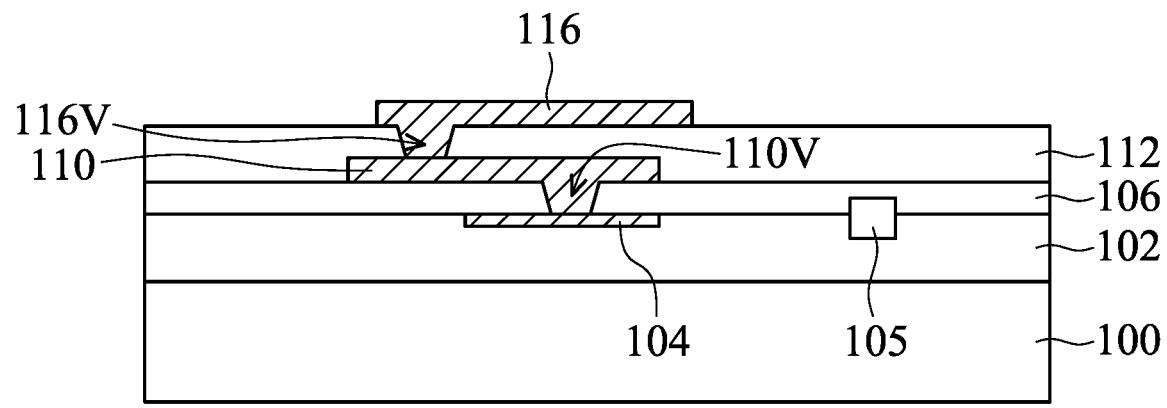

As shown in FIG. 1E, a conductive feature 116 is formed over the conductive feature 110, in accordance with some embodiments. The conductive feature 116 is electrically connected to the conductive feature 104. In some embodiments, the conductive feature 116 is in direct contact with the conductive feature 110. The material and formation method of the conductive feature 116 may be the same as or similar to those of the conductive feature 110. In some embodiments, the insulating layer 112 is in direct contact with the conductive features 110 and 116.

The conductive feature 116 extends into the opening 114 to form electrical connections to the conductive feature 110, as shown in FIG. 1E. The portion of the conductive feature 116 filling the opening 114 forms a conductive via 116V. The top view of the conductive via 116V may have a circular profile, an oval profile, a rectangular profile, a square profile, or the like.

The portion of the conductive feature 116 over the top surface of the insulating layer 112 may function as a conductive line for routing. In some embodiments, the conductive line of the conductive feature 116 is thicker than the conductive feature 104. The thickness of the conductive line of the conductive feature 116 may be in a range from about 1 μm to about 10 μm. The portion of the conductive feature 116 over the top surface of the insulating layer 112 may function as a conductive pad for receiving and/or holding a conductive bump that will be formed later.

In some embodiments, the conductive via 116V is laterally separated from the conductive via 110V, as shown in FIG. 1E. The conductive via 116V does not overlap the conductive via 110V in the vertical direction, as shown in FIG. 1E. The conductive vias 116V and 110V are misaligned with each other. In a subsequent bonding process, the applied bonding force may thus be prevented from being highly concentrated at the conductive vias to form high stress. The reliability and performance of the semiconductor device structure are improved.

Many variations and/or modifications can be made to embodiments of the disclosure. In some other embodiments, more levels of conductive features (including, for example, conductive vias) and the insulating layers surrounding these conductive features are formed between the conductive via 110V and the conductive feature 104.

Figure 1F:
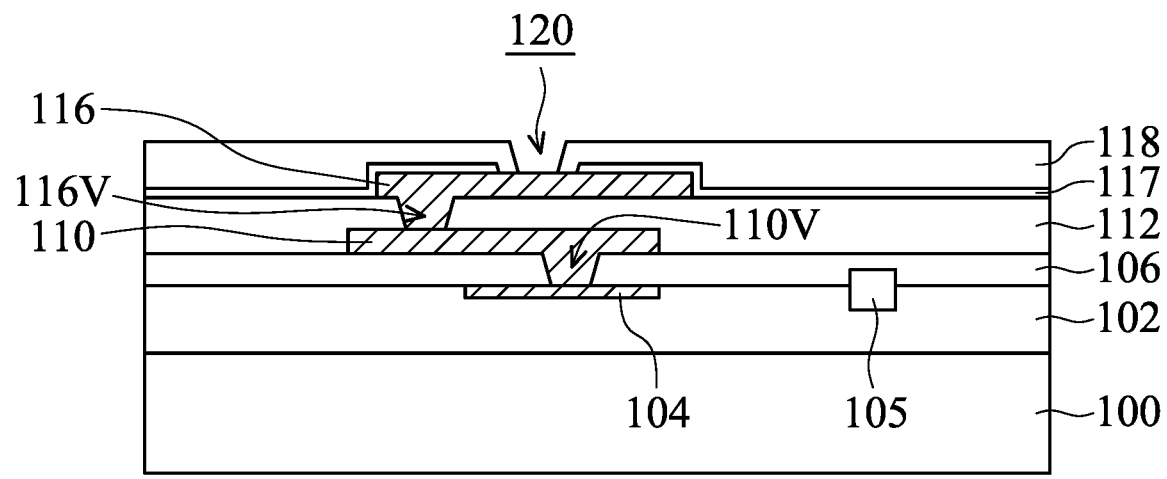

As shown in FIG. 1F, a patterned protection layer 117 is formed over the insulating layer 112 and the conductive feature 116, in accordance with some embodiments. The patterned protection layer 117 has an opening that partially exposes the conductive feature 116 thereunder. The material and formation method of the patterned protection layer 117 may be the same as or similar to those of the passivation layer 106.

However, embodiments of the disclosure are not limited thereto. Many variations and/or modifications can be made to embodiments of the disclosure. In some other embodiments, the patterned protection layer 117 is not formed.

As shown in FIG. 1F, an insulating layer 118 is formed over the patterned protection layer 117 and the conductive feature 116, in accordance with some embodiments. The material and formation method of the insulating layer 118 may be the same as or similar to those of the insulating layer 112.

Afterwards, the insulating layer 118 is partially removed to form an opening 120, as shown in FIG. 1F in accordance with some embodiments. The opening 120 partially exposes the conductive feature 116. The top view of the opening 120 may have a circular profile, an oval profile, a rectangular profile, a square profile, or the like. The formation of the opening 120 may be the same as or similar to the opening 114 as illustrated in FIG. 1D.

Figure 1G:
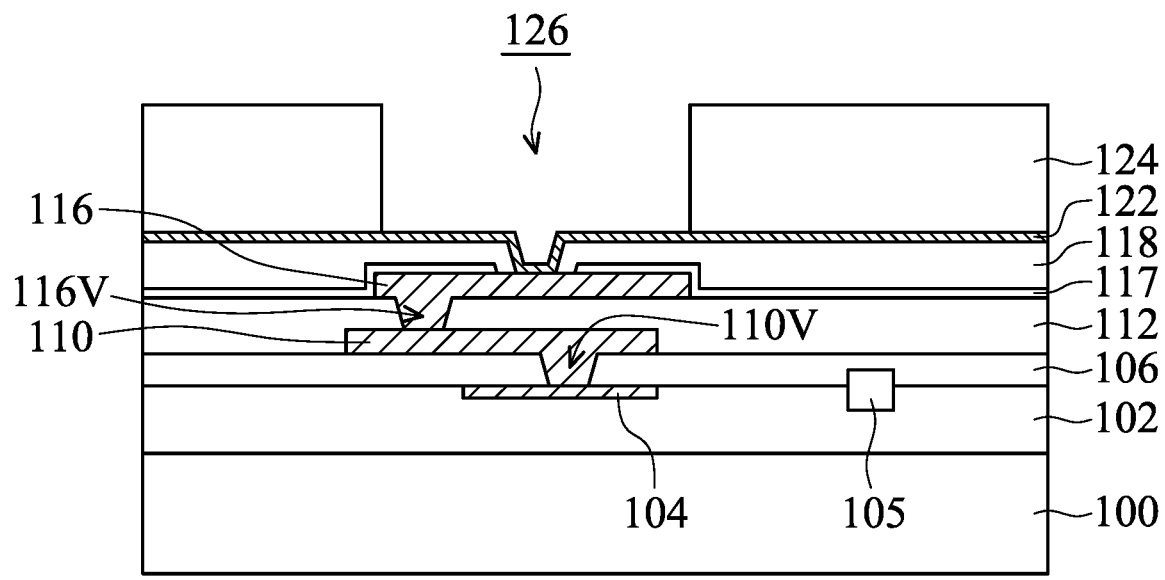

As shown in FIG. 1G, an under-bump metallization (UBM) layer 122 is deposited over the insulating layer 118 and the conductive feature 116, in accordance with some embodiments. The UBM layer 122 may be a single layer or a stack of multiple layers. For example, the UBM layer 122 may be made of or include Ti, TiW, TiCu, Ni, Cu, one or more other suitable materials, or a combination thereof. In some embodiments, the UBM layer 122 includes sub-layers including, for example, a glue layer (or a diffusion barrier layer) and a seed layer.

In some embodiments, the glue layer is made of or includes titanium nitride (TiN), titanium (Ti), tantalum (Ta), tantalum nitride (TaN), one or more other suitable materials, or a combination thereof. In some embodiments, the seed layer is a copper-containing seed layer formed on the glue layer. The copper-containing seed layer may be made of or include pure copper or one of many copper alloys that include silver, chromium, nickel, tin, gold, one or more other suitable elements, or a combination thereof.

In some embodiments, the UBM layer 122 is deposited by using a physical vapor deposition (PVD) process (including, for example, a sputtering process or an evaporation process), a chemical vapor deposition (CVD) process, an atomic layer deposition (ALD) process, an electroless plating process, one or more other applicable processes, or a combination thereof.

Afterwards, a mask layer 124 is formed over the UBM layer 122, as shown in FIG. 1G in accordance with some embodiments. The mask layer 124 is used to define the position where a conductive bump (such as conductive pillars) will be formed later. In some embodiments, the mask layer 124 is a photoresist layer, a dry film, one or more other suitable films, or a combination thereof. In some embodiments, the mask layer 124 is deposited using a spin coating process, a spray coating process, a CVD process, an attachment process, one or more other applicable processes, or a combination thereof.

As shown in FIG. 1G, the mask layer 124 is patterned to form an opening 126. The opening 126 exposes a portion of the UBM layer 122 above the conductive feature 116. The opening 126 may also define the shape and size of the conductive pillar that will be formed in the opening 126 later. In some embodiments, the mask layer 124 is patterned using a photolithography process involving one or more masking, exposing, baking, developing, and rinsing processes (not necessarily in that order).

Figure 1H:
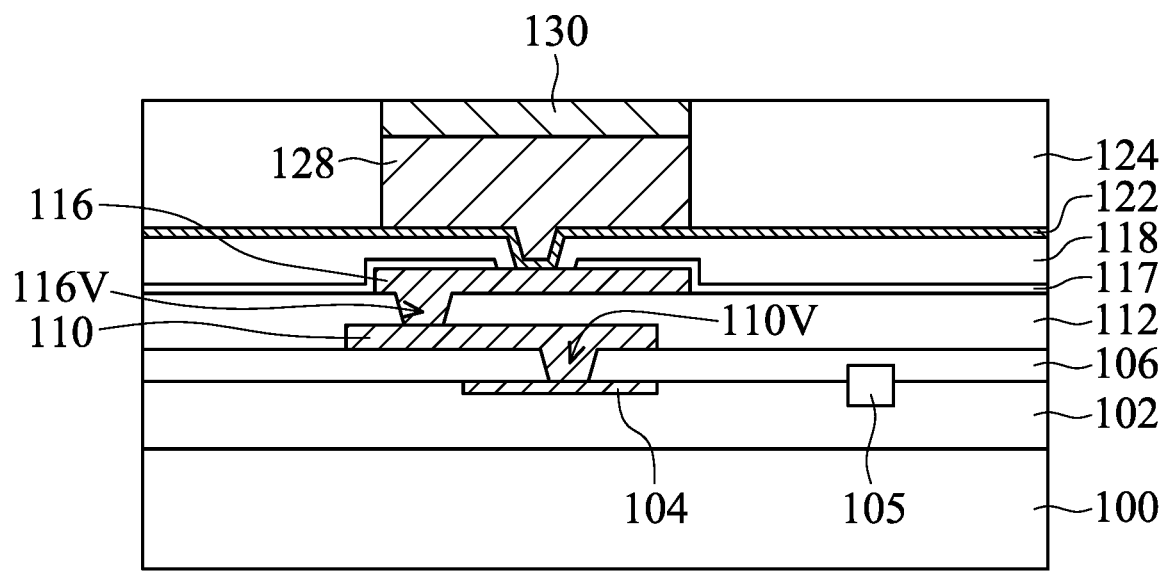

As shown in FIG. 1H, a conductive material is deposited over the portion of the UBM layer 122 exposed by the opening 126 of the mask layer 124, in accordance with some embodiments. The conductive material forms a conductive pillar 128, as shown in FIG. 1H. In some embodiments, the conductive pillar 128 is made of or includes copper (Cu), gold (Au), platinum (Pt), titanium (Ti), nickel (Ni), aluminum (Al), one or more other suitable materials, or a combination thereof. In some embodiments, the conductive pillar 128 is made of pure elemental copper, copper containing some impurities, or copper alloys containing minor amounts of other elements. For example, the copper alloys may contain tantalum, indium, tin, zinc, manganese, chromium, titanium, germanium, strontium, platinum, magnesium, aluminum, zirconium, one or more other suitable elements, or a combination thereof.

In some embodiments, the conductive pillar 128 is formed using an electroplating process, an electroless plating process, a CVD process, a PVD process, one or more other applicable processes, or a combination thereof. In some embodiments, the UBM layer 122 functions as an electroplating seed layer. A suitable conductive material, such as copper, is electroplated on the UBM layer 122 to form the conductive pillar 128.

Afterwards, a solder material is formed over the conductive pillar 128, as shown in FIG. 1H in accordance with some embodiments. The solder material forms a solder element 130. In some embodiments, the solder element 130 is in direct contact with the conductive pillar 128. The solder element 130 may be made of a tin-containing material. The tin-containing material may further include lead (Pb), silver (Ag), bismuth (Bi), copper (Cu), gold (Ag), aluminum (Al), arsenic (As), iron (Fe), nickel (Ni), antimony (Sb), one or more other suitable materials, or a combination thereof. In some other embodiments, the solder element 130 is lead-free. In some embodiments, the solder element 130 are formed over the conductive pillar 128 using an electroplating process, an electroless plating process, a CVD process, a PVD process, one or more other applicable processes, or a combination thereof.

Many variations and/or modifications can be made to embodiments of the disclosure. In some embodiments, a barrier layer (not shown) is formed over the conductive pillar 128 before the solder element 130 is formed. In such cases, the solder element 130 may not be in direct contact with the conductive pillar 128. The barrier layer may be used to prevent ions (such as copper ions) in the conductive pillar 128 from diffusing into the solder element 130. The prevention of ion diffusion (such as copper diffusion) may increase the reliability and bonding strength. In some embodiments, the barrier layer is made of or includes nickel (Ni), gold (Au), tin-lead (SnPb), silver (Ag), palladium (Pd), indium (In), nickel-palladium-gold (NiPdAu), nickel-gold (NiAu), one or more other suitable materials, or a combination thereof. In some embodiments, the barrier layer is formed using an electroplating process, an electroless plating process, a PVD process, a CVD process, one or more other applicable processes, or a combination thereof.

Figure 1I:
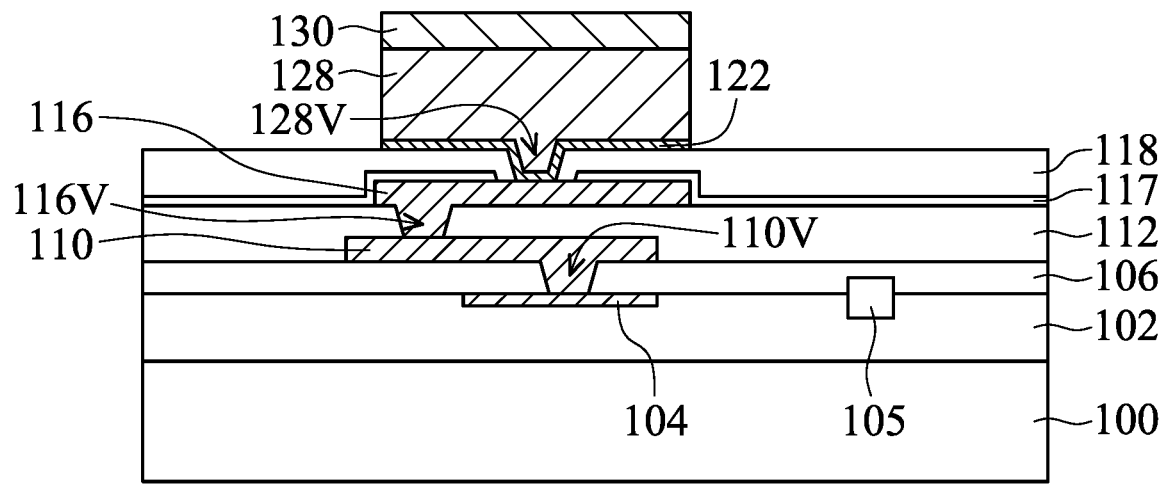

As shown in FIG. 1I, the mask layer 124 is removed, in accordance with some embodiments. In some embodiments, the mask layer 124 is removed using a stripping process, an ashing process, one or more other applicable processes, or a combination thereof.

As shown in FIG. 1I, the UBM layer 122 is then patterned, in accordance with some embodiments. In some embodiments, the UBM layer 122 is patterned using an etching process with the conductive pillar 128 and the solder element 130 as an etching mask. The etching process may include a dry etching process, a wet etching process, or a combination thereof. After the etching process, the portions of the UBM layer 122 not covered by the etching mask are removed. As a result, the insulating layer 118 is exposed after the etching process. The patterning of the UBM layer 122 may help to prevent short circuiting between the conductive pillar 128 and another conductive pillar nearby.

As shown in FIG. 1I, the conductive pillar 128 has a protruding portion 128V. The protruding portion 128V extends towards the semiconductor substrate 100 from a lower surface (such as the lower surface of the conductive pillar 128 extending over the top surface of the insulating layer 118) of the conductive pillar 128. In some embodiments, the conductive pillar 128 has vertical sidewalls, and the protruding portion 128V has inclined sidewalls.

Figure 1J:
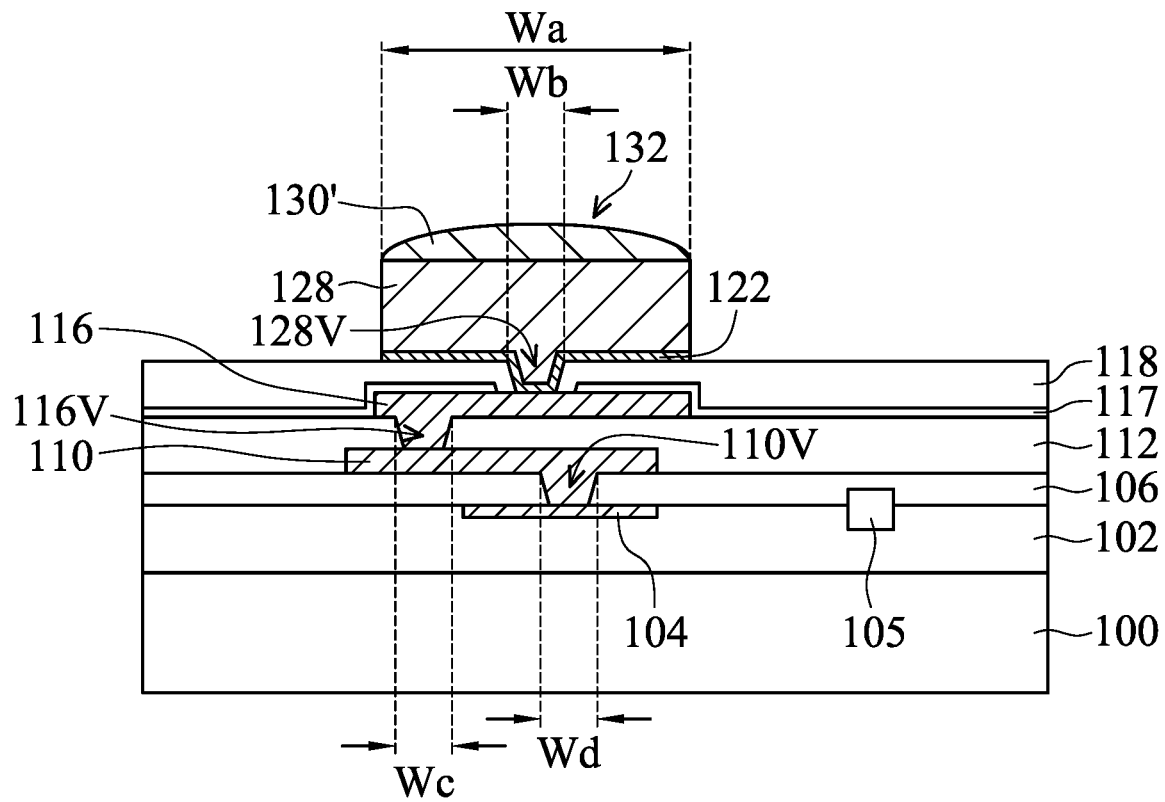

As shown in FIG. 1J, the solder element 130 is reflowed to form a solder bump 130' over the conductive pillar 128, in accordance with some embodiments. In some embodiments, the solder element 130 is reflowed at a reflow temperature ranging from about 200 degrees C. to about 280 degrees C. In some embodiments, the solder bump 130' has curved upper surfaces. The solder bump 130', the UBM layer 122, and the conductive pillar 128 together form a conductive bump 132, as shown in FIG. 1J. In some embodiments, the insulating layer 118 is in direct contact with the conductive bump 132 and the conductive feature 116.

In some embodiments, the semiconductor substrate 100 is a semiconductor wafer. In some embodiments, a dicing process is performed to separate the semiconductor substrate 100 (such as a semiconductor wafer) and the elements above into multiple separated semiconductor chips (or semiconductor dies). One of the semiconductor chips is shown in FIG. 1J. In some embodiments, the semiconductor chip is packaged in a package structure. Alternatively, in some other embodiments, the dicing process is not performed. In such cases, the entirety of the semiconductor substrate 100 (such as a semiconductor wafer) and the elements above it may be packaged in a package structure.

As shown in FIG. 1J, the conductive bump 132 has a width Wa. The width Wa may be the maximum lateral width of the conductive bump 132 or the conductive pillar 128. The width Wa may be in a range from about 0.05 μm to about 600 μm.

As shown in FIG. 1J, the protruding portion 128V of the conductive pillar 128 has a width Wb. The width Wb may be the maximum lateral width of the protruding portion 128V. The width Wb may be in a range from about 5 nm to about 500 μm. A ratio (Wb/Wa) of the width Wb to the width Wa may be in a range from about 0.1 to about 0.9.

As shown in FIG. 1J, the conductive via 116V has a width Wc. The width Wc may be the maximum lateral width of the conductive via 116V. The width Wc may be in a range from about 5 nm to about 500 μm. A ratio (Wc/Wa) of the width Wc to the width Wa may be in a range from about 0.1 to about 0.9. In some embodiments, the width Wc is substantially equal to the width Wb. In some other embodiments, the width Wc is greater than the width Wd.

As shown in FIG. 1J, the conductive via 110V has a width Wd. The width Wd may be the maximum lateral width of the conductive via 110V. The width Wd may be in a range from about 5 nm to about 500 μm. A ratio (Wd/Wa) of the width Wd to the width Wa may be in a range from about 0.1 to about 0.9. In some embodiments, the width Wd is substantially equal to the width Wb. In some other embodiments, the width Wb is greater than the width Wb.

Figure 2:
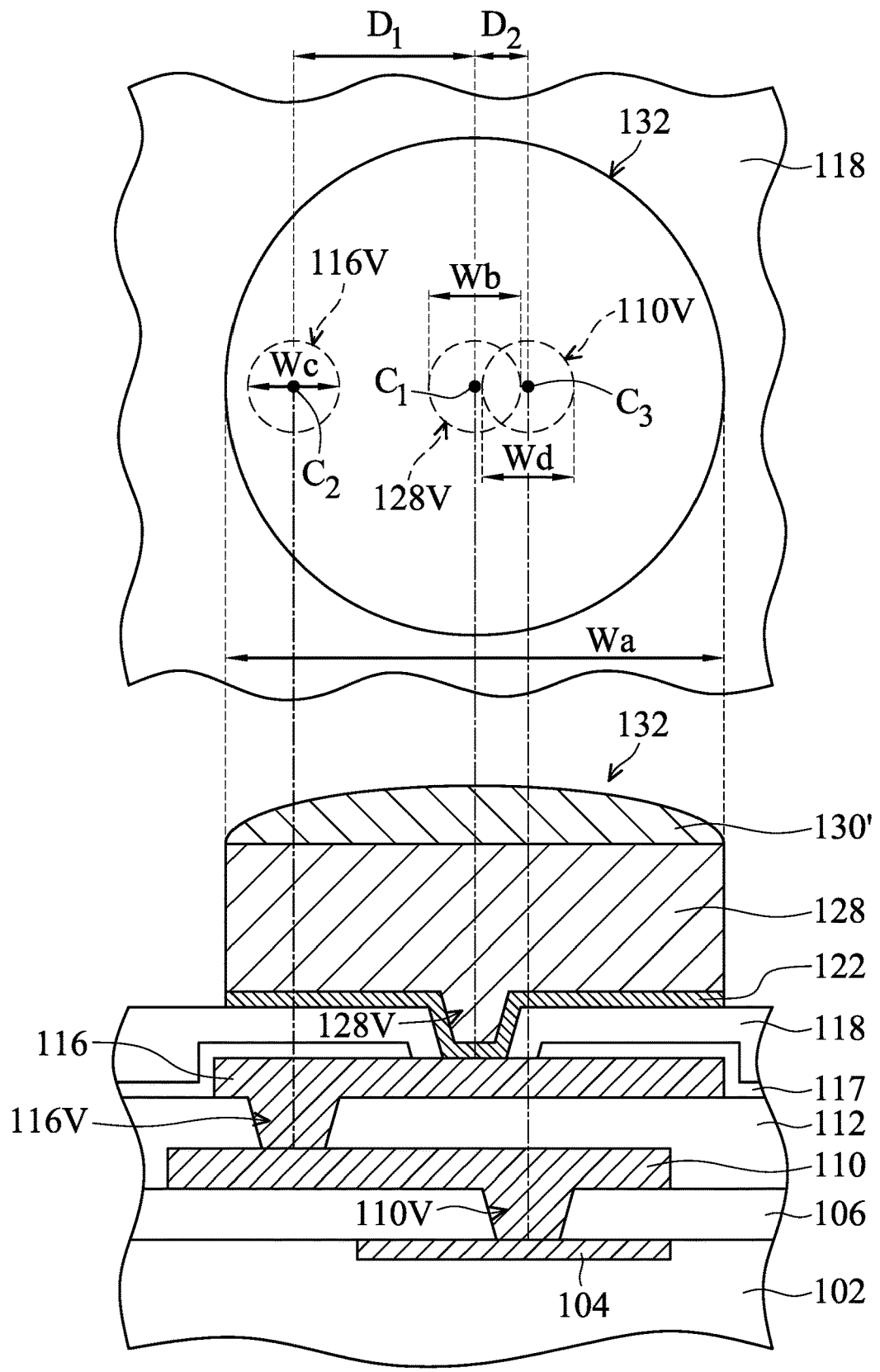
FIG. 2 shows a plan view and a cross-sectional view of a portion of a semiconductor device structure, in accordance with some embodiments.

FIG. 2 shows a plan view and a cross-sectional view of a portion of a semiconductor device structure, in accordance with some embodiments. In some embodiments, FIG. 2 shows the cross-sectional view and the corresponding plan view of a portion of the structure shown in FIG. 1J. As shown in FIG. 2, imaginary lines respectively passing through the centers $C_1$, $C_2$, and $C_3$ of the protruding portion 128V, the conductive via 116V, and the conductive via 110V are illustrated in dashed lines. In some embodiments, the entirety of the conductive vias 116V and 110V are directly under and/or covered by the conductive pillar 128 of the conductive bump 132.

In some embodiments, the protruding portion 128V of the conductive pillar 128 does not overlap the conductive via 116V in the vertical direction, as shown in FIG. 2. In some embodiments, the protruding portion 128V of the conductive pillar 128 does not overlap the center $C_2$ of the conductive via 116V in the vertical direction, as shown in FIG. 2. The vertical direction may mean the direction that is substantially perpendicular to the main surface of the semiconductor substrate 100. In some embodiments, the protruding portion 128V of the conductive pillar 128 does not overlap the center $C_3$ of the conductive via 110V in the vertical direction, as shown in FIG. 2. In some embodiments, the conductive vias 116V and 110V do not overlap each other in the vertical direction, as shown in FIG. 2.

In some embodiments, the center $C_1$ of the protruding portion 128V is laterally separated from the center $C_2$ of the conductive via 116V by a first distance $D_1$, as shown in FIG. 2. In some embodiments, the center $C_1$ of the protruding portion 128V is laterally separated from the center $C_3$ of the conductive via 110V by a second distance $D_2$, as shown in FIG. 2. In some embodiments, the first distance $D_1$ is greater than the second distance $D_2$.

In some embodiments, the first distance $D_1$ is greater than the combination of half of the width Wb of the protruding portion 128V and half of the width Wc of the conductive via 116V. The first distance $D_1$ may be in a range from about 10 nm to 300 μm. The first distance $D_1$ may be in a range from about 2 times of the width Wb to 0.5 times of the width Wa of the conductive pillar 128. In some embodiments, the second distance $D_2$ is greater than half of the width Wb of the protruding portion 128V. The second distance $D_2$ may be in a range from about 5 nm to about 300 μm. The second distance $D_2$ may be in a range from about 0.5 times of the width Wb to 0.5 times of the width Wa of the conductive pillar 128.

As shown in FIG. 2, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 3:
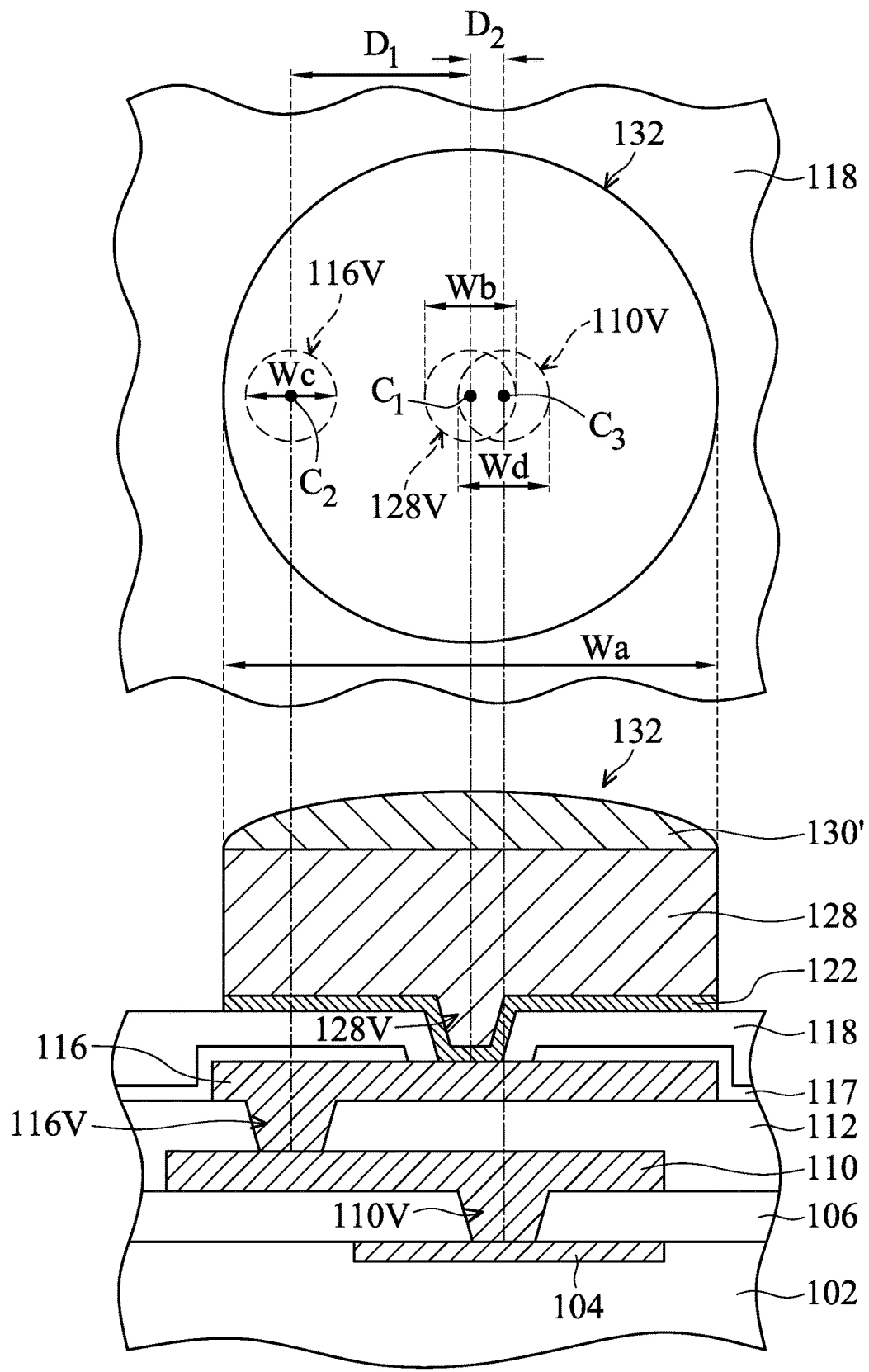
FIG. 3 shows a plan view and a cross-sectional view of a portion of a semiconductor device structure, in accordance with some embodiments.

Many variations and/or modifications can be made to embodiments of the disclosure. FIG. 3 shows a plan view and a cross-sectional view of a portion of a semiconductor device structure, in accordance with some embodiments. As shown in FIG. 3, imaginary lines respectively passing through the centers $C_1$, $C_2$, and $C_3$ of the protruding portion 128V, the conductive via 116V, and the conductive via 110V are illustrated in dashed lines. In some embodiments, the entirety of the conductive vias 116V and 110V are directly under and/or covered by the conductive pillar 128 of the conductive bump 132.

In some embodiments, the protruding portion 128V of the conductive pillar 128 does not overlap the conductive via 116V in the vertical direction, as shown in FIG. 3. In some embodiments, the protruding portion 128V of the conductive pillar 128 does not overlap the center $C_2$ of the conductive via 116V in the vertical direction, as shown in FIG. 3. The vertical direction may mean the direction that is substantially perpendicular to the main surface of the semiconductor substrate 100. In some embodiments, the protruding portion 128V of the conductive pillar 128 overlaps the center $C_3$ of the conductive via 110V in the vertical direction, as shown in FIG. 3. In some embodiments, the conductive vias 116V and 110V do not overlap each other in the vertical direction, as shown in FIG. 3.

In some embodiments, the center $C_1$ of the protruding portion 128V is laterally separated from the center $C_2$ of the conductive via 116V by a first distance $D_1$, as shown in FIG. 3. In some embodiments, the center $C_1$ of the protruding portion 128V is laterally separated from the center $C_3$ of the conductive via 110V by a second distance $D_2$, as shown in FIG. 3. In some embodiments, the first distance $D_1$ is greater than the second distance $D_2$. The first distance $D_1$ in FIG. 3 may be in a range that is similar to the first distance $D_1$ as illustrated in FIG. 2.

In some embodiments, the second distance $D_2$ is less than half of the width Wb of the protruding portion 128V. The second distance $D_2$ may be in a range from about 4 nm to about 300 μm. The second distance $D_2$ may be in a range from about 0.3 times of the width Wb to 0.5 times of the width Wa of the conductive pillar 128.

As shown in FIG. 3, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 4:
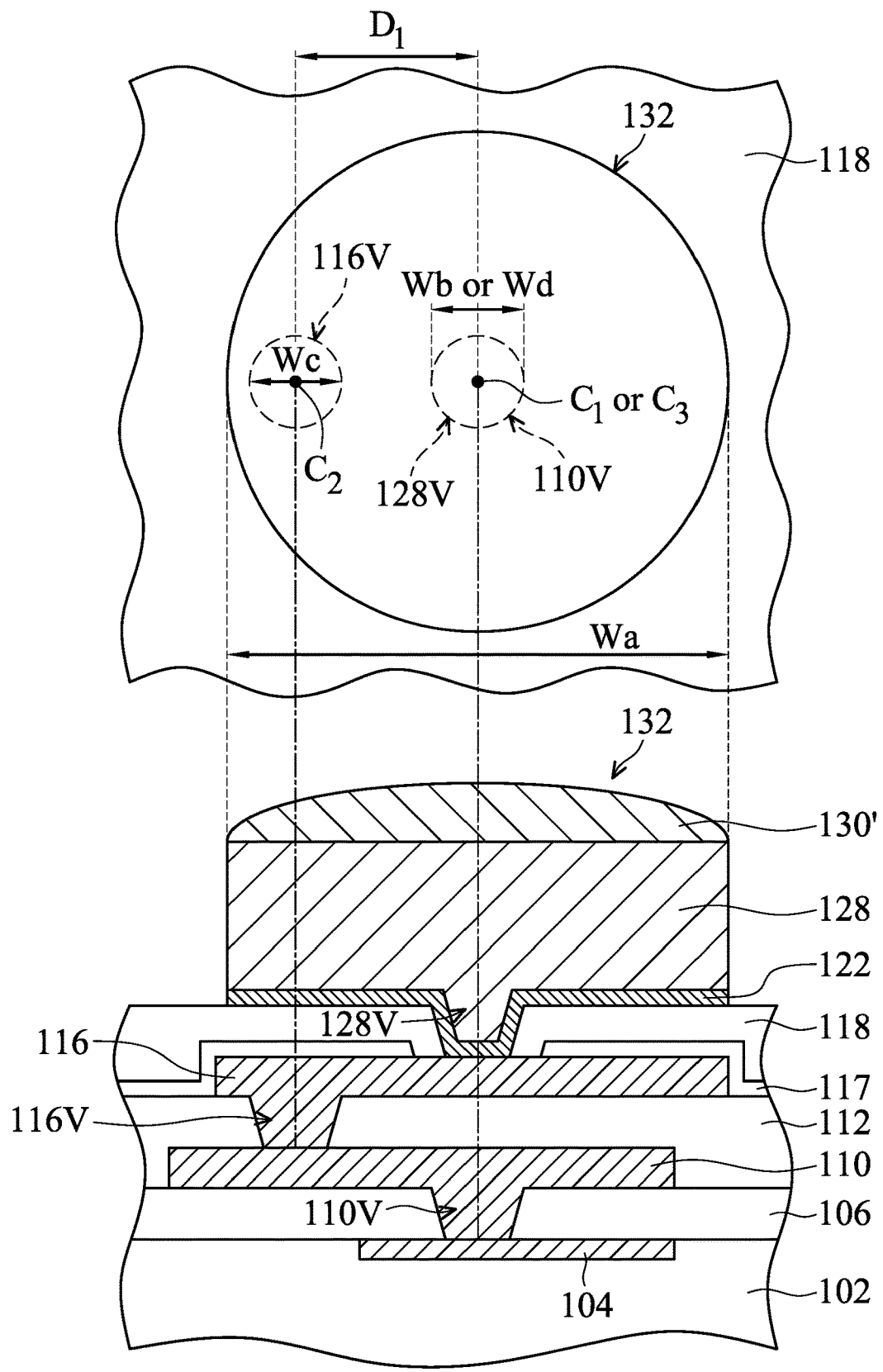
FIG. 4 shows a plan view and a cross-sectional view of a portion of a semiconductor device structure, in accordance with some embodiments.

Many variations and/or modifications can be made to embodiments of the disclosure. FIG. 4 shows a plan view and a cross-sectional view of a portion of a semiconductor device structure, in accordance with some embodiments. As shown in FIG. 4, imaginary lines respectively passing through the centers $C_1$ (or $C_3$) and $C_2$ of the protruding portion 128V (or the conductive via 110V) and the conductive via 116V are illustrated in dashed lines. In some embodiments, the entirety of the conductive vias 116V and 110V are directly under and/or covered by the conductive pillar 128 of the conductive bump 132.

In some embodiments, the protruding portion 128V of the conductive pillar 128 does not overlap the conductive via 116V in the vertical direction, as shown in FIG. 4. In some embodiments, the protruding portion 128V of the conductive pillar 128 does not overlap the center $C_2$ of the conductive via 116V in the vertical direction, as shown in FIG. 4. The vertical direction may mean the direction that is substantially perpendicular to the main surface of the semiconductor substrate 100. In some embodiments, the protruding portion 128V of the conductive pillar 128 overlaps the conductive via 110V in the vertical direction, as shown in FIG. 4. In some embodiments, the center $C_1$ of the protruding portion 128V and the center $C_3$ of the conductive via 110V are substantially aligned with each other. In some embodiments, the center $C_1$ and the center $C_3$ completely overlap each other. In some embodiments, the conductive vias 116V and 110V do not overlap each other in the vertical direction, as shown in FIG. 4.

In some embodiments, the center $C_1$ of the protruding portion 128V is laterally separated from the center $C_2$ of the conductive via 116V by a first distance $D_1$, as shown in FIG. 4. The first distance $D_1$ in FIG. 4 may be in a range that is similar to the first distance $D_1$ as illustrated in FIG. 2.

As shown in FIG. 4, the protruding portion 128V (or the conductive via 110V) and the conductive via 116V are misaligned with each other, in accordance with some embodiments. In a subsequent bonding process, the applied bonding force may thus be prevented from being highly concentrated at the conductive via 116V and the protruding portion 128V (or the conductive via 110V) to form high stress. The reliability and performance of the semiconductor device structure are improved.

Figure 5:
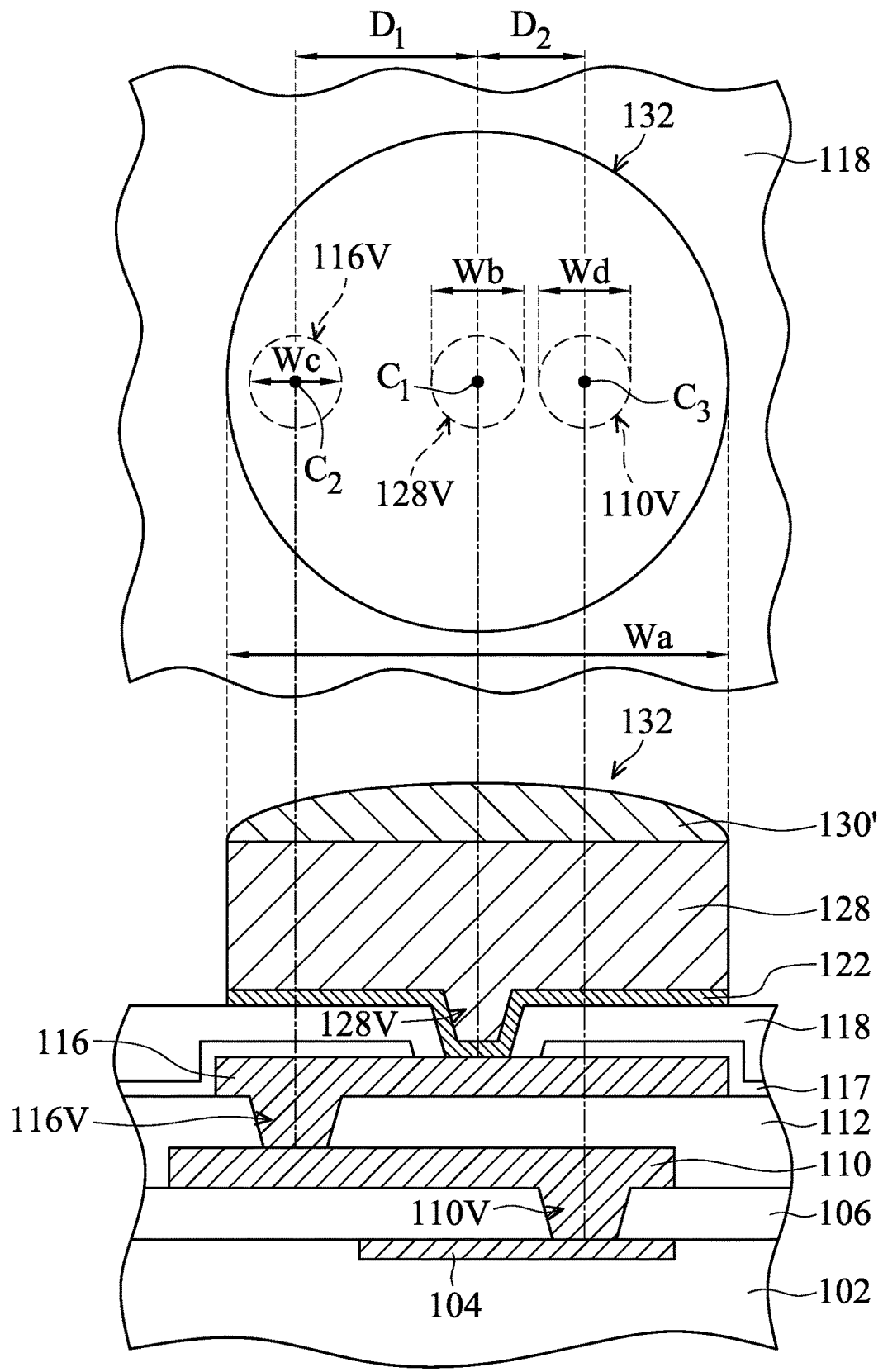
FIG. 5 shows a plan view and a cross-sectional view of a portion of a semiconductor device structure, in accordance with some embodiments.

Many variations and/or modifications can be made to embodiments of the disclosure. FIG. 5 shows a plan view and a cross-sectional view of a portion of a semiconductor device structure, in accordance with some embodiments. As shown in FIG. 5, imaginary lines respectively passing through the centers $C_1$, $C_2$, and $C_3$ of the protruding portion 128V, the conductive via 116V, and the conductive via 110V are illustrated in dashed lines. In some embodiments, the entirety of the conductive vias 116V and 110V are directly under and/or covered by the conductive pillar 128 of the conductive bump 132.

In some embodiments, the protruding portion 128V of the conductive pillar 128 does not overlap the conductive via 116V in the vertical direction, as shown in FIG. 5. In some embodiments, the protruding portion 128V of the conductive pillar 128 does not overlap the center $C_2$ of the conductive via 116V in the vertical direction, as shown in FIG. 5. The vertical direction may mean the direction that is substantially perpendicular to the main surface of the semiconductor substrate 100. In some embodiments, the protruding portion 128V of the conductive pillar 128 does not overlap the center $C_3$ of the conductive via 110V in the vertical direction, as shown in FIG. 5. In some embodiments, the conductive vias 116V and 110V do not overlap each other in the vertical direction, as shown in FIG. 5.

In some embodiments, the center $C_1$ of the protruding portion 128V is laterally separated from the center $C_2$ of the conductive via 116V by a first distance $D_1$, as shown in FIG. 5. In some embodiments, the center $C_1$ of the protruding portion 128V is laterally separated from the center $C_3$ of the conductive via 110V by a second distance $D_2$, as shown in FIG. 5. In some embodiments, the first distance $D_1$ is greater than the second distance $D_2$. In some other embodiments, the first distance $D_1$ is substantially equal to the second distance $D_2$. The first distance $D_1$ in FIG. 5 may be in a range that is similar to the first distance $D_1$ as illustrated in FIG. 2.

In some embodiments, the second distance $D_2$ is greater than the combination of half of the width Wb of the protruding portion 128V and half of the width Wd of the conductive via 110V. The second distance $D_2$ may be in a range from about 5 nm to about 300 μm. The second distance $D_2$ may be in a range from about one time of the width Wb to 0.5 times of the width Wa of the conductive pillar 128.

As shown in FIG. 5, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 6:
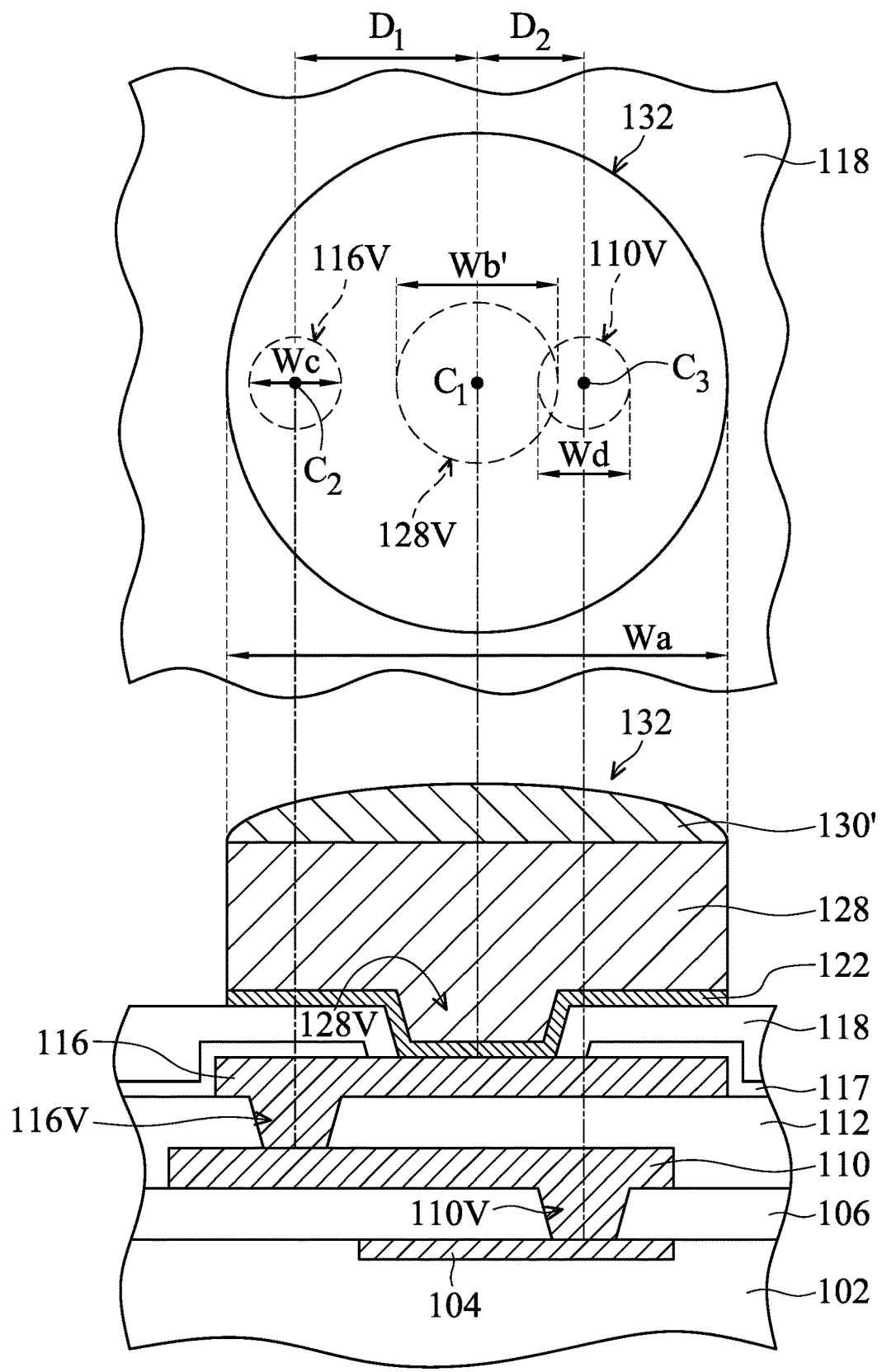
FIG. 6 shows a plan view and a cross-sectional view of a portion of a semiconductor device structure, in accordance with some embodiments.

Many variations and/or modifications can be made to embodiments of the disclosure. For example, the sizes and/or shapes of the top views of the protruding portion 128V and the conductive vias 116V and/or 110V may be varied. FIG. 6 shows a plan view and a cross-sectional view of a portion of a semiconductor device structure, in accordance with some embodiments. As shown in FIG. 6, imaginary lines respectively passing through the centers $C_1$, $C_2$, and $C_3$ of the protruding portion 128V, the conductive via 116V, and the conductive via 110V are illustrated in dashed lines. In some embodiments, FIG. 6 shows the plane view and the cross-sectional view of a structure that is similar to that shown in FIG. 2. In some embodiments, the entirety of the conductive vias 116V and 110V are directly under and/or covered by the conductive pillar 128 of the conductive bump 132.

The main difference therebetween includes that the protruding portion 128V of the conductive pillar 128 has a width Wb' that is wider than that of the conductive via 116V or the conductive via 110V. In some embodiments, similar to the embodiments illustrated in FIG. 2, the conductive pillar 128 does not overlap the center $C_3$ of the conductive via 110V in the vertical direction, as shown in FIG. 6. The wider protruding portion 128V may enable the conductive pillar 128 in FIG. 6 to have a better strength to sustain the subsequent processes. The reliability and performance of the conductive bump 132 are thus improved.

As shown in FIG. 6, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 7:
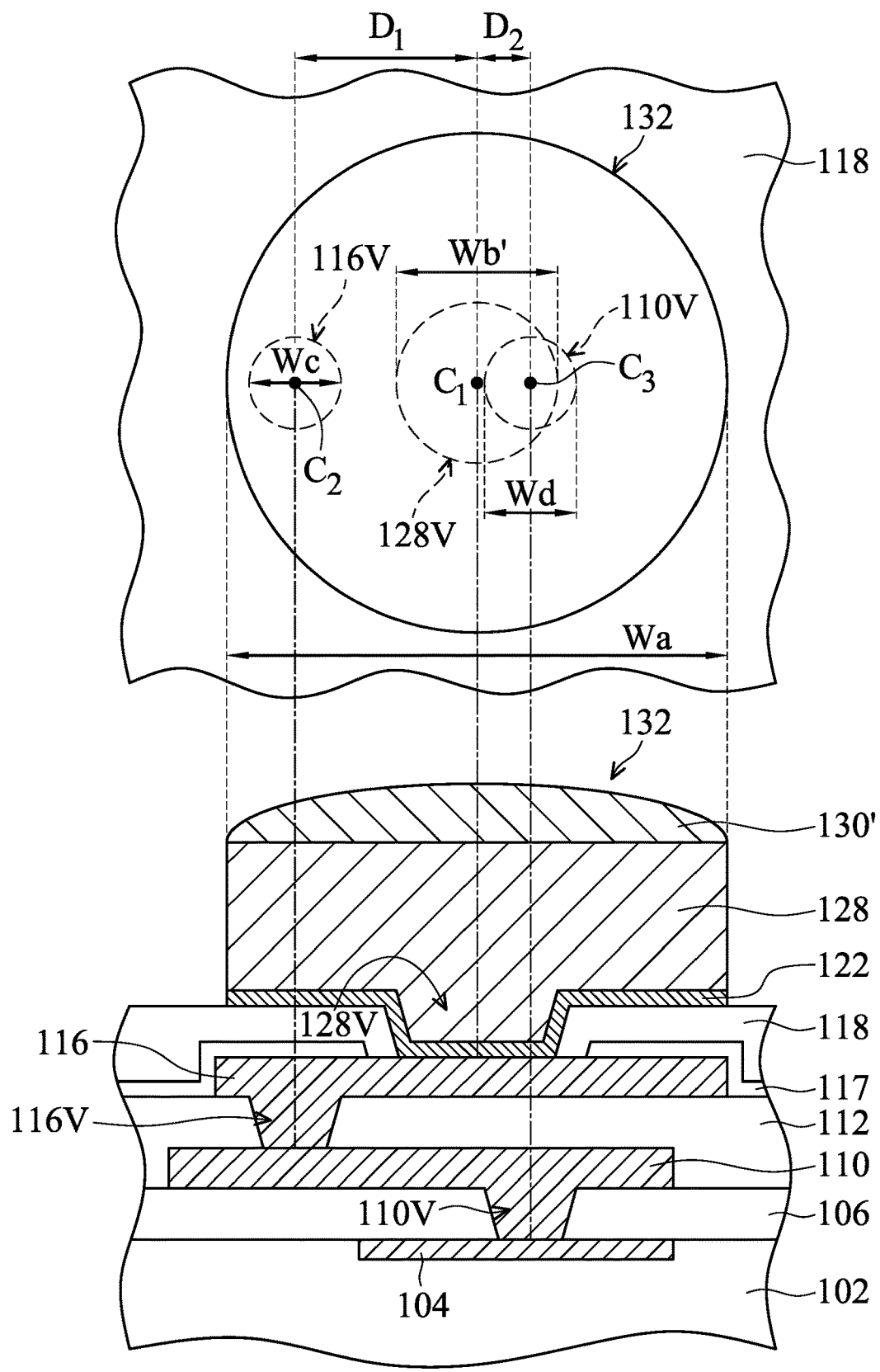
FIG. 7 shows a plan view and a cross-sectional view of a portion of a semiconductor device structure, in accordance with some embodiments.

Many variations and/or modifications can be made to embodiments of the disclosure. FIG. 7 shows a plan view and a cross-sectional view of a portion of a semiconductor device structure, in accordance with some embodiments. As shown in FIG. 7, imaginary lines respectively passing through the centers $C_1$, $C_2$, and $C_3$ of the protruding portion 128V, the conductive via 116V, and the conductive via 110V are illustrated in dashed lines. In some embodiments, FIG. 7 shows the plane view and the cross-sectional view of a structure that is similar to that shown in FIG. 3. In some embodiments, the entirety of the conductive vias 116V and 110V are directly under and/or covered by the conductive pillar 128 of the conductive bump 132.

The main difference therebetween includes that the protruding portion 128V of the conductive pillar 128 has a width Wb' that is wider than that of the conductive via 116V or the conductive via 110V. In some embodiments, similar to the embodiments illustrated in FIG. 3, the protruding portion 128V of the conductive pillar 128 overlaps the center $C_3$ of the conductive via 110V in the vertical direction, as shown in FIG. 7. The wider protruding portion 128V may enable the conductive pillar 128 in FIG. 7 to have a better strength to sustain the subsequent processes. The reliability and performance of the conductive bump 132 are thus improved.

As shown in FIG. 7, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 8:
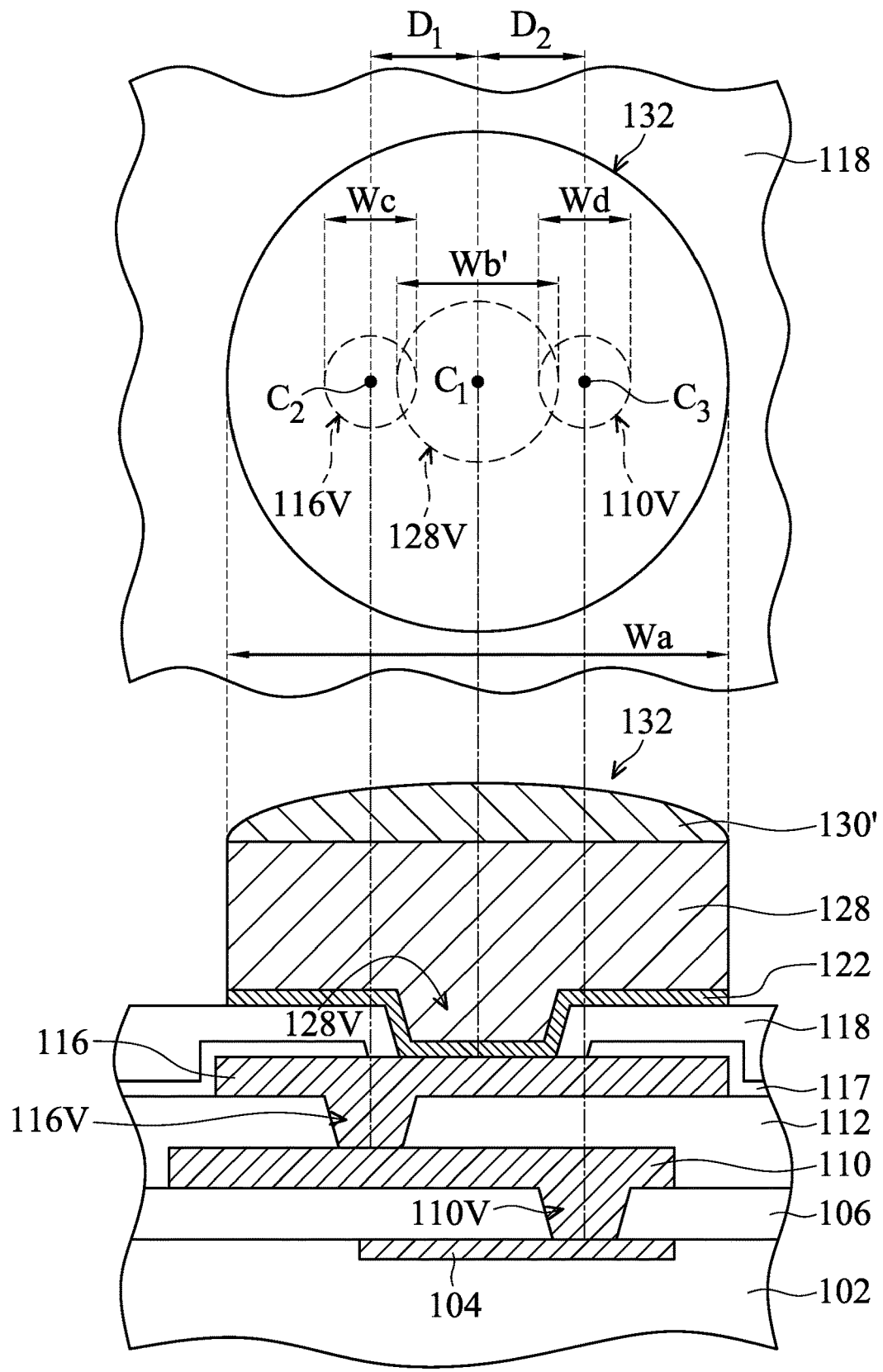
FIG. 8 shows a plan view and a cross-sectional view of a portion of a semiconductor device structure, in accordance with some embodiments.

Many variations and/or modifications can be made to embodiments of the disclosure. FIG. 8 shows a plan view and a cross-sectional view of a portion of a semiconductor device structure, in accordance with some embodiments. As shown in FIG. 8, imaginary lines respectively passing through the centers $C_1$, $C_2$, and $C_3$ of the protruding portion 128V, the conductive via 116V, and the conductive via 110V are illustrated in dashed lines. In some embodiments, FIG. 8 shows the plane view and the cross-sectional view of a structure that is similar to that shown in FIG. 6. In some embodiments, the entirety of the conductive vias 116V and 110V are directly under and/or covered by the conductive pillar 128 of the conductive bump 132.

The main difference therebetween includes that the protruding portion 128V of the conductive pillar 128 overlaps the conductive via 116V in the vertical direction, as shown in FIG. 8 in accordance with some embodiments. In some embodiments, the center $C_1$ of the protruding portion 128V does not overlap the center $C_2$ of the conductive via 116V.

As shown in FIG. 8, the center $C_1$ of the protruding portion 128V is laterally separated from the center $C_2$ of the conductive via 116V by the first distance $D_1$. The center $C_1$ of the protruding portion 128V is laterally separated from the center $C_3$ of the conductive via 110V by the second distance $D_2$. In some embodiments, the first distance $D_1$ is substantially equal to the second distance $D_2$. In some other embodiments, the first distance $D_1$ is greater than the second distance $D_2$.

As shown in FIG. 8, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 9:
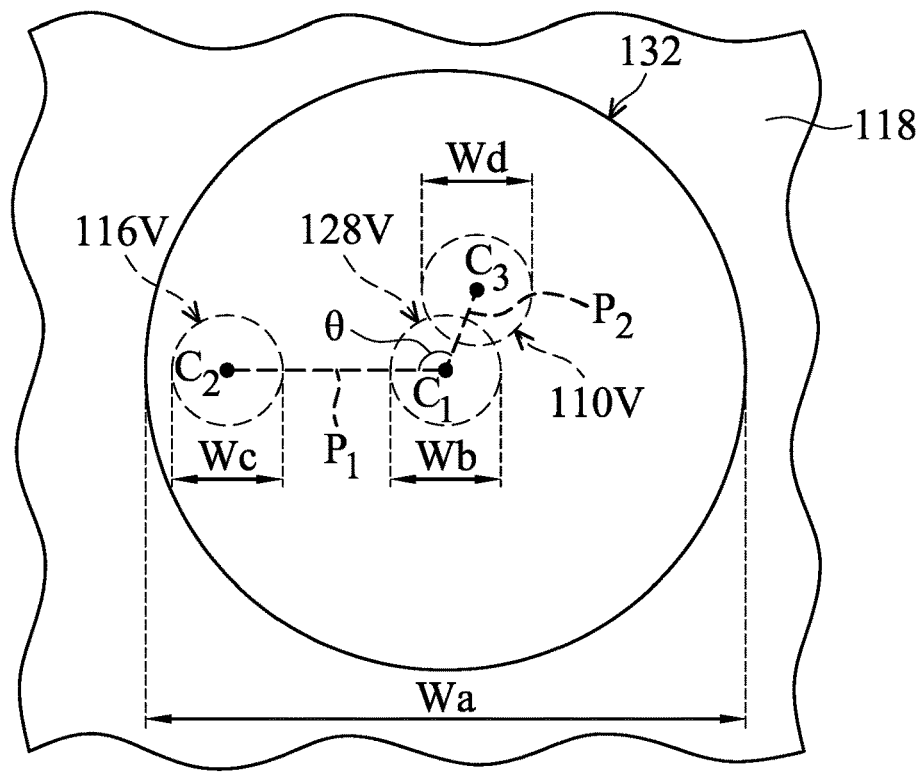
FIG. 9 shows a plan view of a portion of a semiconductor device structure, in accordance with some embodiments.

Many variations and/or modifications can be made to embodiments of the disclosure. FIG. 9 shows a plan view of a portion of a semiconductor device structure, in accordance with some embodiments. As shown in FIG. 9, an imaginary plane $P_1$ passes through the center $C_1$ of the protruding portion 128V and the center $C_2$ of the conductive via 116V. An imaginary plane $P_2$ passes through the center $C_1$ of the protruding portion 128V and the center $C_3$ of the conductive via 110V. In some embodiments, the entirety of the conductive vias 116V and 110V are directly under and/or covered by the conductive pillar 128 of the conductive bump 132.

In some embodiments, the imaginary planes $P_1$ and $P_2$ form an angle θ that is less than 180 degrees, as shown in FIG. 9. The angle θ may be in a range from about 20 degrees to about 175 degrees. In some other embodiments, the angle θ is an obtuse angle. In such cases, the angle θ may be in a range from about 95 degrees to about 175 degrees. In some cases, the arrangement of having the angle to be an obtuse angle may further improve the reliability of the conductive bump 132 since the protruding portion 128V, the conductive via 116V, and the conductive via 110V are laterally separated from each other to prevent stress from being concentrated. In some embodiments, similar to the embodiments illustrated in FIG. 2, the protruding portion 128V does not overlap the center $C_3$ of the conductive via 110V in the vertical direction.

As shown in FIG. 9, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 10:
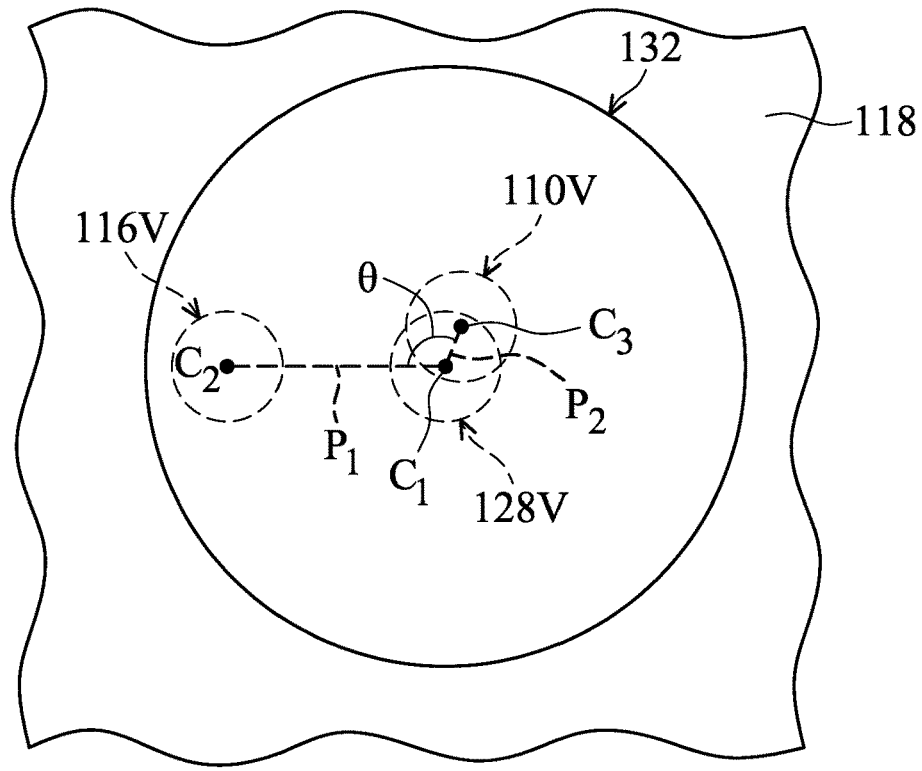
FIG. 10 shows a plan view of a portion of a semiconductor device structure, in accordance with some embodiments.

Many variations and/or modifications can be made to embodiments of the disclosure. FIG. 10 shows a plan view of a portion of a semiconductor device structure, in accordance with some embodiments. In some embodiments, the entirety of the conductive vias 116V and 110V are directly under and/or covered by the conductive pillar 128 of the conductive bump 132. In some embodiments, similar to the embodiments illustrated in FIG. 9, the imaginary planes $P_1$ and $P_2$ form the angle θ that is less than 180 degrees. In some embodiments, the angle θ is an obtuse angle. In some embodiments, similar to the embodiments illustrated in FIG. 3, the protruding portion 128V overlaps the center $C_3$ of the conductive via 110V in the vertical direction, as shown in FIG. 10.

As shown in FIG. 10, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

Figure 11:
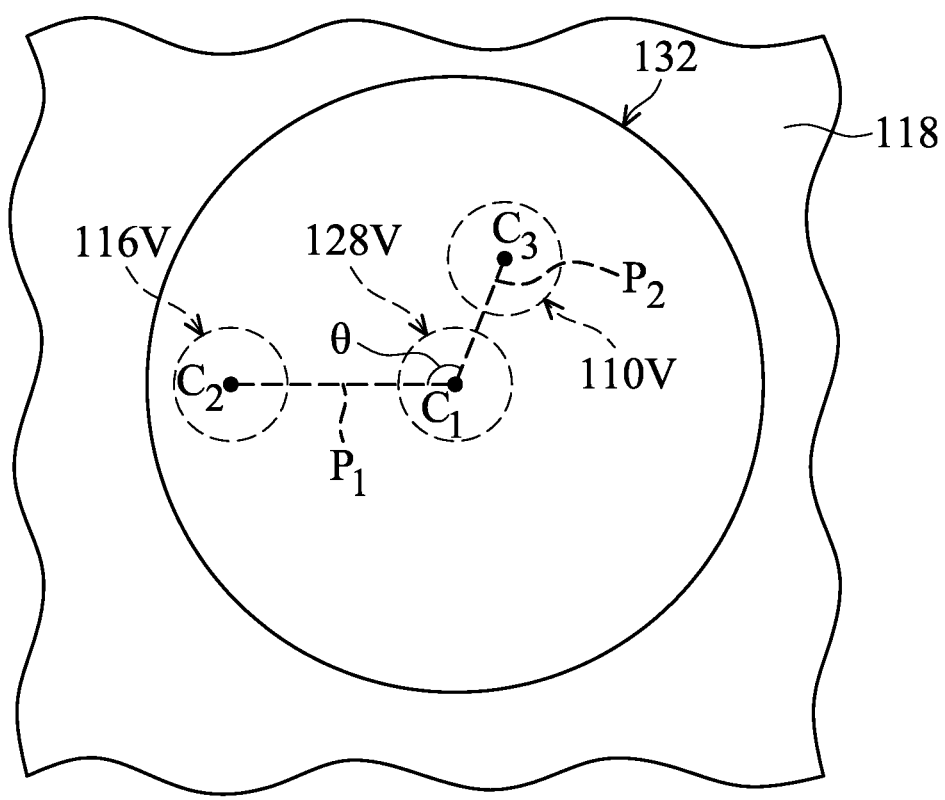
FIG. 11 shows a plan view of a portion of a semiconductor device structure, in accordance with some embodiments.

Many variations and/or modifications can be made to embodiments of the disclosure. FIG. 11 shows a plan view of a portion of a semiconductor device structure, in accordance with some embodiments. In some embodiments, the entirety of the conductive vias 116V and 110V are directly under and/or covered by the conductive pillar 128 of the conductive bump 132. In some embodiments, similar to the embodiments illustrated in FIG. 9, the imaginary planes $P_1$ and $P_2$ form the angle θ that is less than 180 degrees. In some embodiments, the angle θ is an obtuse angle. In some embodiments, similar to the embodiments illustrated in FIG. 5, the protruding portion 128V does not overlaps the conductive via 110V and the conductive via 116V in the vertical direction, as shown in FIG. 11.

As shown in FIG. 11, the protruding portion 128V, the conductive via 116V, and the conductive via 110V are misaligned with each other, in accordance with some embodiments. In a subsequent bonding process, the applied bonding force may thus be prevented from being highly concentrated at the conductive vias 116V and 110V and the protruding portion 128V to form high stress. The reliability and performance of the semiconductor device structure are improved.

In embodiments illustrated in FIGS. 9-11, the sizes and shapes of the top views of the protruding portions 128V and the conductive vias 110V and 116V are substantially the same. However, embodiments of the disclosure are not limited thereto. Many variations and/or modifications can be made to embodiments of the disclosure. For example, in some other embodiments, the top view shape of one or some of the protruding portions 128V and the conductive vias 110V and 116V is other than a circular shape. One or some of the protruding portions 128V and the conductive vias 110V and 116V may have an oval top view shape. In some other embodiments, the sizes of the protruding portions 128V and the conductive vias 110V and 116V are different from each other. In some embodiments, similar to the embodiments illustrated in FIGS. 6-8, the protruding portions 128V is wider than the conductive via 110V and/or the conductive via 116V.

Figure 12:
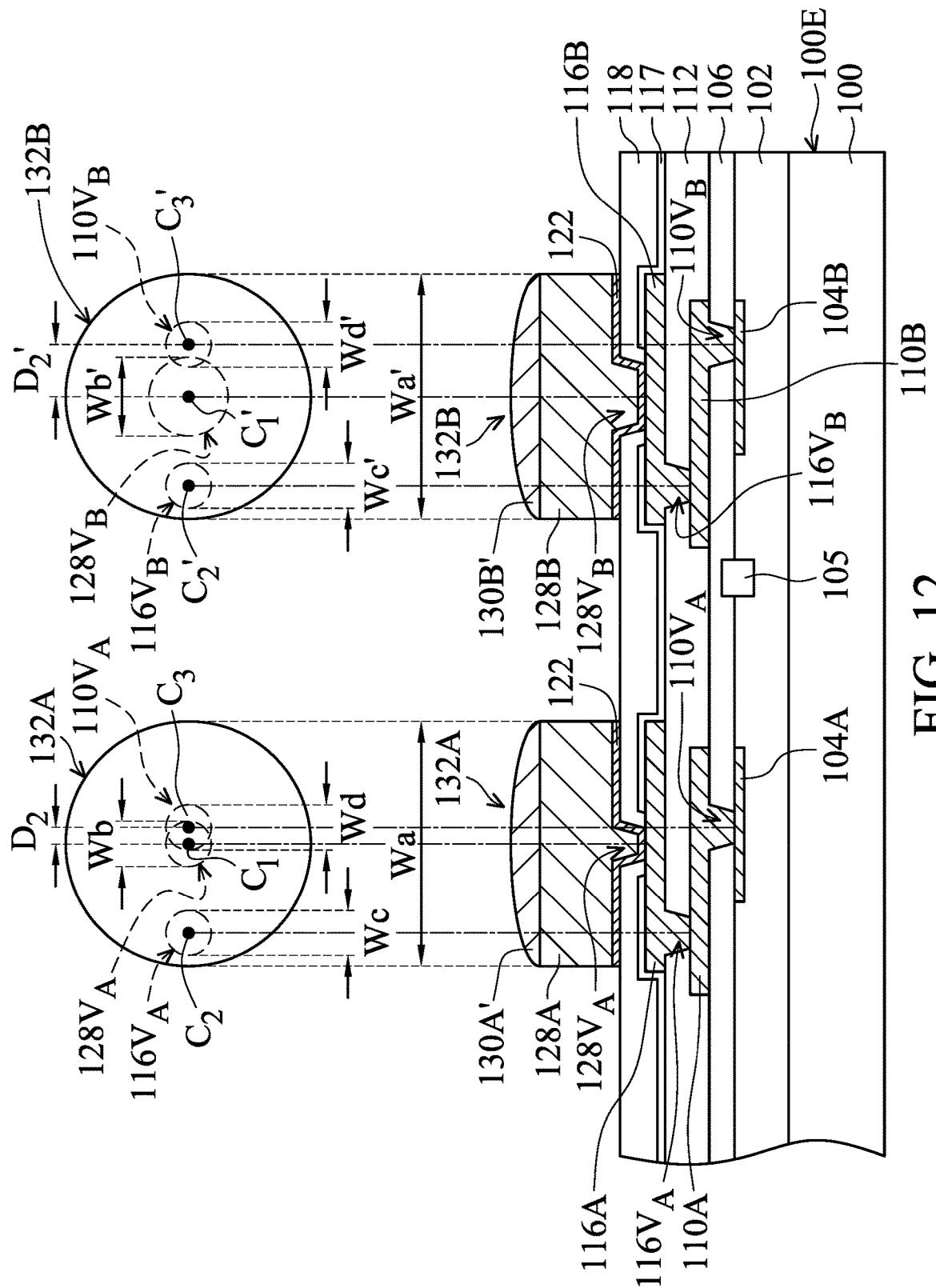
FIG. 12 shows plan views and a cross-sectional view of a portion of a semiconductor device structure, in accordance with some embodiments.

Many variations and/or modifications can be made to embodiments of the disclosure. FIG. 12 shows plan views and a cross-sectional view of a portion of a semiconductor device structure, in accordance with some embodiments. The semiconductor device structure includes a first conductive bump 132A and a second conductive bump 132B. In some embodiments, the first conductive bump 132A is closer to the center of the semiconductor substrate 100 than the second conductive bump 132B. In some embodiments, the second conductive bump 132B is closer to an edge 100E of the semiconductor substrate 100 than the first conductive bump 132A.

The first conductive bump 132A includes a first conductive pillar 128A and a first solder bump 130A'. The second conductive bump 132B includes a second conductive pillar 128B and a second solder bump 130B'. The first conductive pillar 128A and the second conductive pillar 128B have a first protruding portion $128V_A$ and a second protruding portion $128V_B$, respectively. In some embodiments, the first conductive pillar 128A is closer to the center of the semiconductor substrate 100 than the second conductive pillar 128B.

As shown in FIG. 12, the first conductive pillar 128A and the second conductive pillar 128B has widths Wa and Wa', respectively. In some embodiments, the widths Wa and Wa' are the maximum lateral widths of the first conductive pillar 128A and the second conductive pillar 128B, respectively. In some embodiments, the widths Wa and Wa' are substantially equal to each other, as shown in FIG. 12. In some other embodiments, the width Wa' is greater than the width Wa.

Similar to the embodiments illustrated in FIGS. 1A-1J, the first conductive bump 132A is electrically connected to a conductive feature 104A of the interconnection structure 102 through conductive features 110A and 116A. The conductive features 110A and 116A has conductive vias $110V_A$ and $116V_A$, respectively. In some embodiments, the centers $C_1$, $C_2$, and $C_3$ of the protruding portion $128V_A$, the conductive via $116V_A$, and the conductive via $110V_A$ are misaligned with each other, as shown in FIG. 12. In some embodiments, the widths Wb, Wc, and Wd of the protruding portion $128V_A$, the conductive via $116V_A$, and the conductive via $110V_A$ are substantially equal to each other.

Similarly, the second conductive bump 132B is electrically connected to a conductive feature 104B of the interconnection structure 102 through conductive features 110B and 116B. The conductive features 110B and 116B has conductive vias $110V_B$ and $116V_B$, respectively. In some embodiments, the centers $C_1'$, $C_2'$, and $C_3'$ of the protruding portion $128V_B$, the conductive via $116V_B$, and the conductive via $110V_B$ are misaligned with each other, as shown in FIG. 12. In some embodiments, the width Wb' of the protruding portion $128V_B$ is greater than the width Wc' the conductive via $116V_B$ or the width Wd' of the conductive via $110V_B$. In some embodiments, the protruding portion $128V_B$ is wider than the protruding portion $128V_A$, as shown in FIG. 12.

In some embodiments, the protruding portion $128V_A$ does not overlap the center $C_2$ of the conductive via $116V_A$ in the vertical direction. The protruding portion $128V_A$ overlaps the center $C_3$ of the conductive via $110V_A$ in the vertical direction, as shown in FIG. 12. In some embodiments, the protruding portion $128V_B$ does not overlap the center $C_2'$ of the conductive via $116V_B$ in the vertical direction. The protruding portion $128V_B$ does not overlaps the center $C_3'$ of the conductive via $110V_B$ in the vertical direction, as shown in FIG. 12.

As shown in FIG. 12, the center $C_1$ is laterally separated from the center $C_3$ by the distance $D_2$. The center $C_1'$ is laterally separated from the center $C_3'$ by the distance $D_2'$. In some embodiments, the distance $D_2'$ is greater than the distance $D_2$. In some embodiments, the reliability of the conductive bump 132B that is closer to a high stress region (i.e., the region near the edge 100E of the semiconductor substrate 100) has an improved strength since the protruding portion $128V_B$ is laterally separated from the conductive via $110V_B$ by a greater distance. The protruding portion $128V_B$ that is wider may thus have improved strength to sustain the subsequent bonding process.

Many variations and/or modifications can be made to embodiments of the disclosure. For example, the arrangements of the protruding portion $128V_A$, the conductive via $116V_A$, and the conductive via $110V_A$ may be varied similar to the embodiments illustrated in FIG. 2, 3, 4, 5, 6, 7, 8, 9, 10, or 11. The sizes and/or shapes of the protruding portion 128V$_A$, the conductive via 116V$_A$, and the conductive via 110V$_A$ may be varied.

Many variations and/or modifications can be made to embodiments of the disclosure. For example, the arrangements of the protruding portion 128V$_B$, the conductive via 116V$_B$, and the conductive via 110V$_B$ may be varied similar to the embodiments illustrated in FIG. 2, 3, 4, 5, 6, 7, 8, 9, 10, or 11. The sizes and/or shapes of the protruding portion 128V$_B$, the conductive via 116V$_B$, and the conductive via 110V$_B$ may be varied.

Many variations and/or modifications can be made to embodiments of the disclosure. As mentioned above, the portion of the conductive feature 116 over the top surface of the insulating layer 112 may function as a conductive line for routing. The portion of the conductive feature 116 over the top surface of the insulating layer 112 may also function as a conductive pad for receiving and/or holding a conductive bump that will be formed later.

Figure 13:
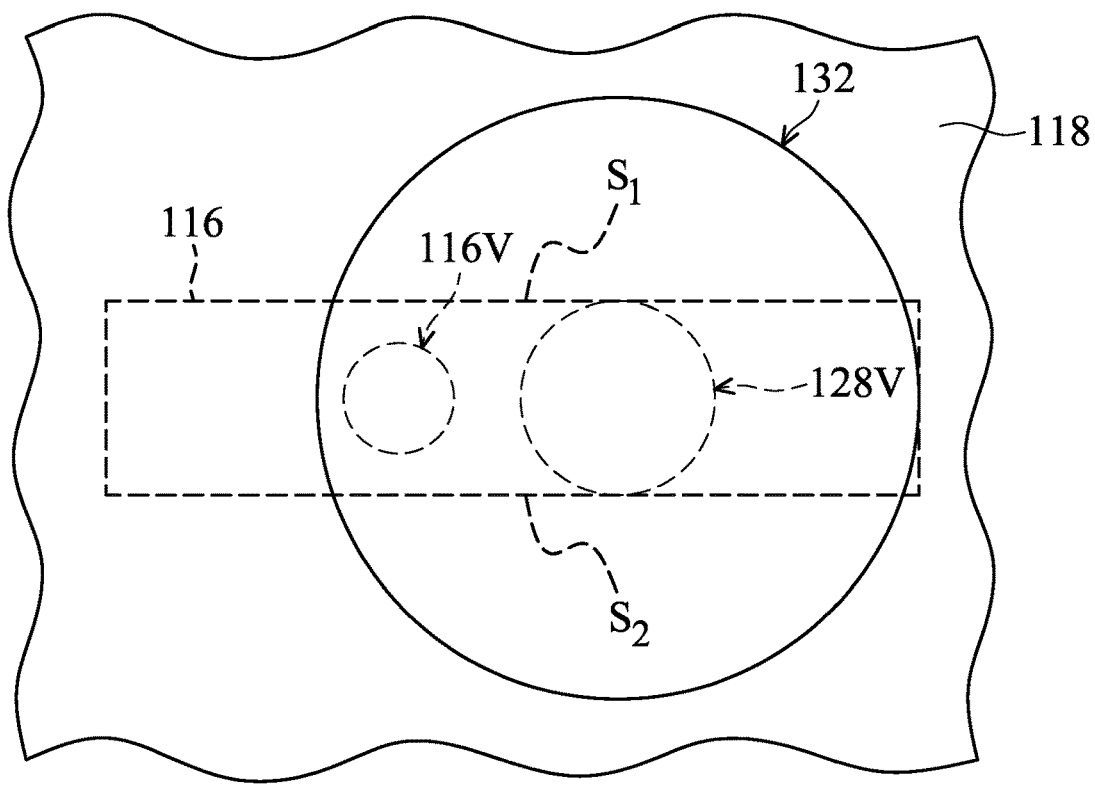
FIG. 13 shows a plan view of a portion of a semiconductor device structure, in accordance with some embodiments.

FIG. 13 shows a plan view of a portion of a semiconductor device structure, in accordance with some embodiments. In some embodiments, FIG. 13 shows the plan view of a portion of the structure shown in FIG. 1J or 12. In FIG. 13, the conductive feature 116, the conductive via 116V and the protruding portion 128V of the conductive pillar 128 that are covered by other elements are illustrated in dashed lines. In some embodiments, the conductive bump 132 (including the conductive pillar 128 as illustrated in FIG. 1J) extends across the opposite sidewalls S$_1$ and S$_2$ of the conductive feature 116, as shown in FIG. 13. The top view of the portion of the conductive feature 116 over the top surface of the insulating layer 112 may have a "line-like" profile.

Figure 14:
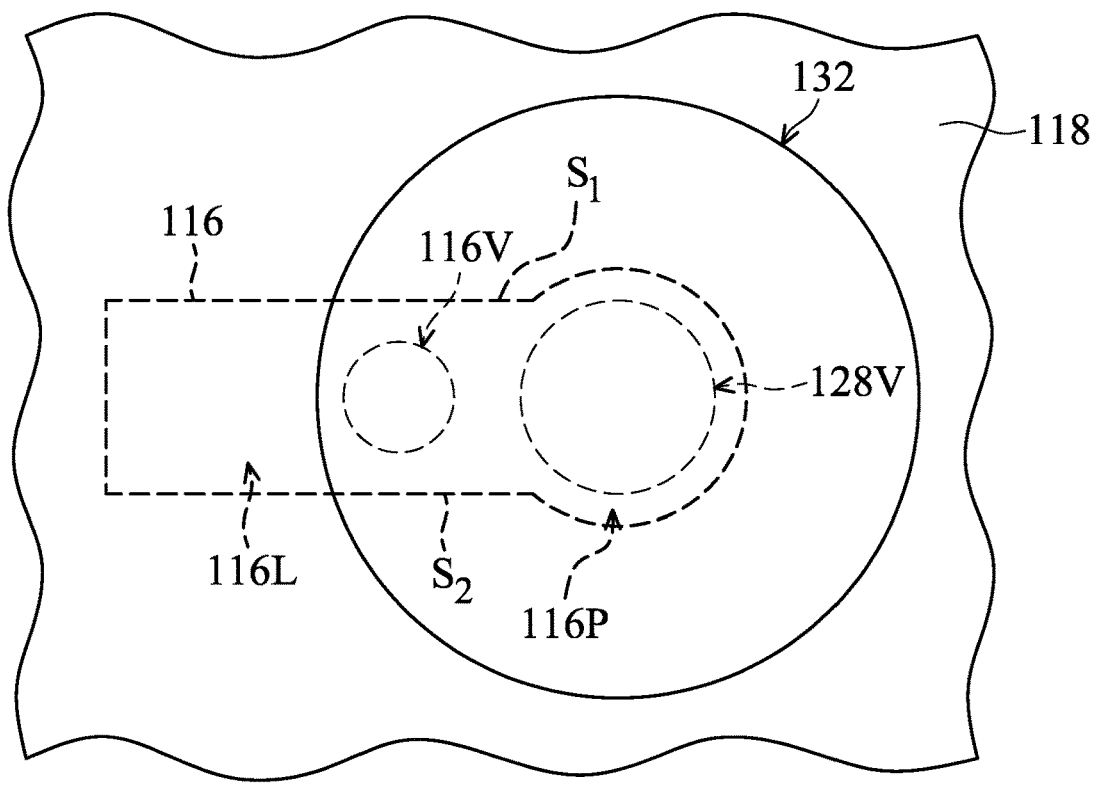
FIG. 14 shows a plan view of a portion of a semiconductor device structure, in accordance with some embodiments.

Many variations and/or modifications can be made to embodiments of the disclosure. FIG. 14 shows a plan view of a portion of a semiconductor device structure, in accordance with some embodiments. In some embodiments, FIG. 14 shows the plan view of a portion of the structure shown in FIG. 1J or 12. In FIG. 14, the conductive feature 116, the conductive via 116V and the protruding portion 128V of the conductive pillar 128 that are covered by other elements are illustrated in dashed lines. In some embodiments, the conductive bump 132 (including the conductive pillar 128 as illustrated in FIG. 1J) extends across the opposite sidewalls S$_1$ and S$_2$ of the conductive feature 116, as shown in FIG. 14. The conductive feature 116 over the top surface of the insulating layer 112 may form a pad-like element 116P that is used for receiving or holding the protruding portion 128V. The pad-like element 116P may include a curved profile. In some embodiments, the entirety of the pad-like element 116P of the conductive feature 116 is covered by the conductive bump 132, as shown in FIG. 14.

Figure 15A:
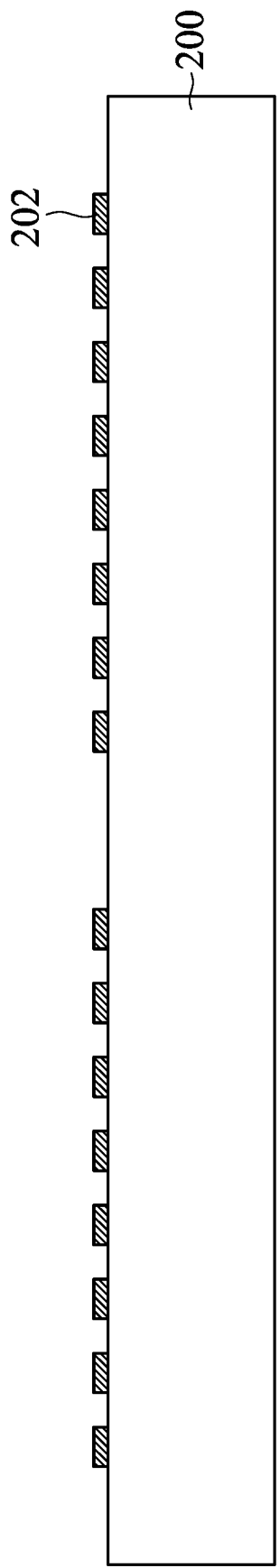
FIGS. 15A-15C are cross-sectional views of various stages of a process for forming a portion of a package structure, in accordance with some embodiments.
Figure 15B:
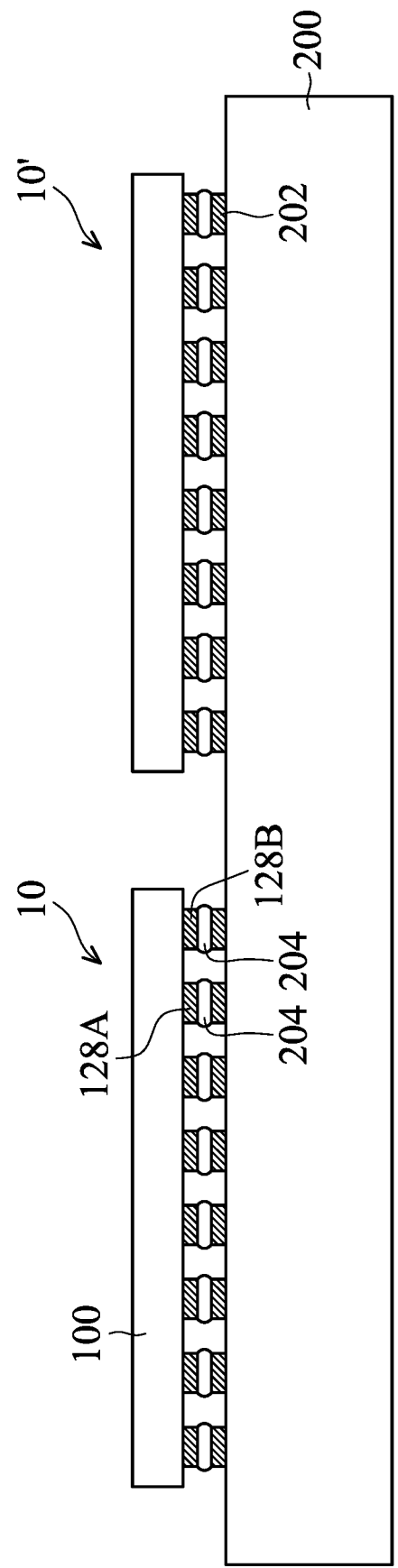
Figure 15C:
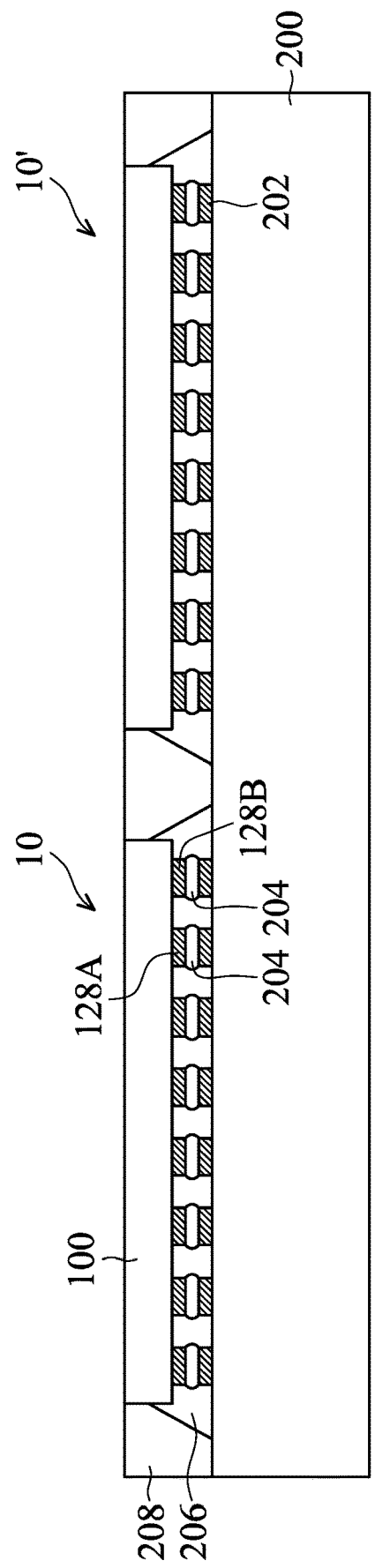

Many variations and/or modifications can be made to embodiments of the disclosure. The semiconductor chip as illustrated in FIGS. 1J, 2, 3, 4, 5, 6, 7, 8, 9, 10, 11, 12, 13, and/or 14 may be integrated into a package structure. FIGS. 15A-15C are cross-sectional views of various stages of a process for forming a portion of a package structure, in accordance with some embodiments.

As shown in FIG. 15A, a redistribution structure 200 is formed or provided, in accordance with some embodiments. The redistribution structure 200 may be a package substrate (such as a circuit board), an interposer substrate (such as a semiconductor interposer or a polymer interposer), an interconnection structure of a wafer, a polymer-containing interconnection structure formed over a carrier substrate, or the like. In some embodiments, the redistribution structure 200 includes conductive pads 202 that may be used to receive and hold one or more semiconductor chips.

As shown in FIG. 15B, semiconductor chips 10 and 10' are bonded to the conductive pads 202, in accordance with some embodiments. The semiconductor chips 10 and 10' may have the same or similar structures as illustrated in FIGS. 1J, 2, 3, 4, 5, 6, 7, 8, 9, 10, 11, 12, 13, and/or 14. Before the bonding of the semiconductor chips 10 and 10', solder elements and/or flux materials may be formed over the conductive pads 202 to assist in the bonding process. The bonding elements over the conductive pads 202 may be reflowed together with the solder bumps of the semiconductor chips 10 and 10'. As a result, solder bumps 204 are formed to affix the semiconductor chips 10 and 10' on the redistribution structure 200.

The bonding process mentioned above involves applying force between the redistribution structure 200 and the semiconductor chips 10 and 10'. Because protruding portions of the conductive pillars 128A and/or 128B are misaligned with the conductive vias below the conductive pillars 128A and/or 128B, the applied bonding force is prevented from being concentrated at the protruding portions and/or the conductive vias too much. Cracks and/or delamination issues are thus prevented or reduced. The performance and reliability of the package structure are greatly improved.

As shown in FIG. 15C, an underfill material 206 is formed to surround and protect the conductive pillar 128A and 128B and the solder bumps 204, in accordance with some embodiments. The underfill material 206 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 208 is formed over the redistribution structure 200 to surround and protect the semiconductor chips 10 and 10', as shown in FIG. 15C in accordance with some embodiments. In some embodiments, the protective layer 208 is in physical contact with the redistribution structure 200.

However, embodiments of the disclosure are not limited thereto. Many variations and/or modifications can be made to embodiments of the disclosure. In some other embodiments, the underfill material 206 is not formed.

In some embodiments, the protective layer 208 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 208 is greater than the distribution density of the fillers in the underfill material 206. In some embodiments, the weight percentage of the fillers in the protective layer 208 is greater than the weight percentage of the fillers in the underfill material 206. The profiles, sizes, and/or materials of the fillers in the protective layer 208 and the underfill material 206 may be different from each other.

In some embodiments, a molding material (such as a liquid molding material) is introduced or injected to cover the redistribution structure 200 and the semiconductor chips 10 and 10'. In some embodiments, a thermal process is then used to cure the liquid molding material and to transform it into the protective layer 208. In some embodiments, a planarization process is performed to the protective layer

208 to improve the flatness of the protective layer 208. For example, the planarization process may include a grinding process, a CMP process, a dry polishing process, one or more other applicable processes, or a combination thereof. In some embodiments, after the planarization process, the top surface of the protective layer 208 is substantially level with the surfaces of the semiconductor chips 10 and 10'.

Embodiments of the disclosure form a semiconductor device structure with a conductive pillar. The protruding portion of the conductive pillar is designed to be misaligned with the conductive vias formed under the conductive pillar. If a bonding process is then performed, the applied bonding force would be prevented from being concentrated at the protruding portions and/or the conductive vias too much since they are misaligned with each other. Cracks and/or delamination are thus prevented or reduced. The reliability and performance of the semiconductor device structure are greatly improved.

In accordance with some embodiments, a semiconductor device structure is provided. The semiconductor device structure includes an interconnection structure over a semiconductor substrate. The semiconductor device structure also includes a conductive pillar over the interconnection structure. The conductive pillar has a protruding portion extending towards the semiconductor substrate from a lower surface of the conductive pillar. The semiconductor device structure further includes an upper conductive via between the conductive pillar and the interconnection structure. A center of the upper conductive via is laterally separated from a center of the protruding portion by a first distance. In addition, the semiconductor device structure includes a lower conductive via between the upper conductive via and the interconnection structure. The lower conductive via is electrically connected to the conductive pillar through the upper conductive via. A center of the lower conductive via is laterally separated from the center of the protruding portion by a second distance, and the first distance is greater than the second distance.

In accordance with some embodiments, a semiconductor device structure is provided. The semiconductor device structure includes an interconnection structure over a semiconductor substrate. The semiconductor device structure also includes a conductive pillar over the interconnection structure. The conductive pillar has a protruding portion extending towards the semiconductor substrate from a lower surface of the conductive pillar. The semiconductor device structure further includes an upper conductive via between the conductive pillar and the interconnection structure. In addition, the semiconductor device structure includes a lower conductive via between the upper conductive via and the interconnection structure. The lower conductive via is electrically connected to the conductive pillar through the upper conductive via. The protruding portion of the conductive pillar does not overlap a center of the upper conductive via in a vertical direction perpendicular to a main surface of the semiconductor substrate. The upper conductive via does not overlap a center of the lower conductive via in the vertical direction.

In accordance with some embodiments, a method for forming a semiconductor device structure is provided. The method includes forming an interconnection structure over a semiconductor substrate. The method also includes forming a first conducive feature over the interconnection structure, and the first conductive feature has a first conductive via. The method further includes forming a second conductive feature over the first conductive feature. The second conductive feature has a second conductive via, and the first conductive via is laterally separated from the second conductive via. In addition, the method includes forming an insulating layer over the second conductive feature. The method includes forming a conductive pillar over the second conductive feature, and the conductive pillar has a protruding portion extending through the insulating layer. The conductive pillar is electrically connected to the first conductive feature through the second conductive feature. The protruding portion is laterally separated from the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    an interconnection structure over a semiconductor substrate;
    a conductive pillar over the interconnection structure, wherein the conductive pillar has a protruding portion extending towards the semiconductor substrate from a lower surface of the conductive pillar;
    an upper conductive via between the conductive pillar and the interconnection structure; and
    a lower conductive via between the upper conductive via and the interconnection structure, wherein the lower conductive via is electrically connected to the conductive pillar through the upper conductive via, wherein in a top view, the conductive pillar extends across opposite sidewalls of the upper conductive via and opposite sidewalls of the lower conductive via, and in the top view, an entirety of the upper conductive via is separated from an entirety of the protruding portion.

2. The semiconductor device structure as claimed in claim 1, wherein a center of the upper conductive via is laterally separated from a center of the protruding portion by a first distance, a center of the lower conductive via is laterally separated from the center of the protruding portion by a second distance, and the first distance is greater than the second distance.

3. The semiconductor device structure as claimed in claim 2, wherein the second distance is greater than half of a maximum lateral width of the protruding portion of the conductive pillar.

4. The semiconductor device structure as claimed in claim 2, wherein the second distance is less than half of a maximum lateral width of the protruding portion of the conductive pillar.

5. The semiconductor device structure as claimed in claim 1, wherein the upper conductive via is a portion of an upper conductive feature, the lower conductive via is a portion of a lower conductive feature, and the upper conductive feature is in direct contact with the lower conductive feature and the protruding portion of the conductive pillar.

6. The semiconductor device structure as claimed in claim 1, wherein the protruding portion of the conductive pillar does not overlap the lower conductive via in a vertical direction perpendicular to a main surface of the semiconductor substrate, and the protruding portion of the conductive pillar does not overlap the upper conductive via in the vertical direction.

7. The semiconductor device structure as claimed in claim 1, further comprising:
a lower polymer layer surrounding the lower conductive via; and
an upper polymer layer surrounding the upper conductive via, wherein the upper polymer layer is in direct contact with the lower polymer layer.

8. The semiconductor device structure as claimed in claim 1, wherein a first imaginary plane passing through a center of the protruding portion and the center of the upper conductive via and a second imaginary plane passing through the center of the protruding portion and a center of the lower conductive via form an obtuse angle, and the obtuse angle is smaller than 180 degrees.

9. The semiconductor device structure as claimed in claim 8, wherein the protruding portion of the conductive pillar overlaps the lower conductive via in in a vertical direction perpendicular to a main surface of the semiconductor substrate.

10. The semiconductor device structure as claimed in claim 8, wherein the protruding portion of the conductive pillar does not overlap the center of the lower conductive via in a vertical direction perpendicular to a main surface of the semiconductor substrate.

11. A semiconductor device structure, comprising:
an interconnection structure over a semiconductor substrate;
a conductive pillar over the interconnection structure, wherein the conductive pillar has a protruding portion extending towards the semiconductor substrate from a lower surface of the conductive pillar;
an upper conductive via between the conductive pillar and the interconnection structure; and
a lower conductive via between the upper conductive via and the interconnection structure, wherein in a top view, the conductive pillar extends across opposite edges of the upper conductive via and opposite edges of the lower conductive via, and in the top view, an entirety of the upper conductive via is separated from an entirety of the protruding portion.

12. The semiconductor device structure as claimed in claim 11, wherein the upper conductive via does not overlap a center of the lower conductive via in in a vertical direction perpendicular to a main surface of the semiconductor substrate.

13. The semiconductor device structure as claimed in claim 12, wherein the upper conductive via does not overlap the lower conductive via in the vertical direction, and the protruding portion of the conductive pillar does not overlap the upper conductive via in the vertical direction.

14. The semiconductor device structure as claimed in claim 12, wherein the protruding portion of the conductive pillar overlaps the lower conductive via in the vertical direction.

15. The semiconductor device structure as claimed in claim 14, wherein the protruding portion of the conductive pillar overlaps a center of the lower conductive via in the vertical direction.

16. The semiconductor device structure as claimed in claim 14, wherein the protruding portion of the conductive pillar does not overlap a center of the lower conductive via in the vertical direction.

17. The semiconductor device structure as claimed in claim 12, further comprising:
a second conductive pillar over the interconnection structure, wherein the second conductive pillar is closer to a center portion of the semiconductor substrate than the conductive pillar, and the second conductive pillar has a second protruding portion extending towards the semiconductor substrate from a lower surface of the second conductive pillar;
a second upper conductive via between the second conductive pillar and the interconnection structure; and
a second lower conductive via between the second upper conductive via and the interconnection structure, wherein the second lower conductive via is electrically connected to the second conductive pillar through the second upper conductive via, the second protruding portion of the second conductive pillar does not overlap a center of the second upper conductive via in the vertical direction, the second protruding portion of the second conductive pillar overlaps a center of the second lower conductive via in the vertical direction, and the protruding portion of the conductive pillar does not overlap a center of the lower conductive via in the vertical direction.

18. A semiconductor device structure, comprising:
an interconnection structure over a semiconductor substrate;
a conductive pillar over the interconnection structure, wherein the conductive pillar has a protruding portion extending towards the semiconductor substrate;
an upper conductive via between the conductive pillar and the interconnection structure; and
a lower conductive via between the upper conductive via and the interconnection structure, wherein in a top view, the conductive pillar extends across an entirety of the upper conductive via and an entirety of the lower conductive via, and in the top view, the entirety of the upper conductive via is separated from an entirety of the protruding portion.

19. The semiconductor device structure as claimed in claim 18, wherein a first imaginary plane passing through a center of the protruding portion and the center of the upper conductive via and a second imaginary plane passing through the center of the protruding portion and a center of the lower conductive via form an obtuse angle, and the obtuse angle is smaller than 180 degrees.

20. The semiconductor device structure as claimed in claim 18, further comprising:
a lower polymer-containing layer surrounding the lower conductive via; and
an upper polymer-containing layer surrounding the upper conductive via, wherein the upper polymer-containing layer is in direct contact with the lower polymer-containing layer.

* * * * *